(12) United States Patent
Dai et al.

(10) Patent No.: US 12,022,709 B2
(45) Date of Patent: Jun. 25, 2024

(54) ARRAY SUBSTRATE AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Jie Dai, Beijing (CN); Tinghua Shang, Beijing (CN); Yi Zhang, Beijing (CN); Tingliang Liu, Beijing (CN); Siyu Wang, Beijing (CN); Huijuan Yang, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/468,659

(22) Filed: Sep. 15, 2023

(65) Prior Publication Data

US 2024/0008330 A1   Jan. 4, 2024

Related U.S. Application Data

(63) Continuation of application No. 17/428,972, filed as application No. PCT/CN2020/121755 on Oct. 19, 2020, now Pat. No. 11,800,759.

(51) Int. Cl.
*H10K 59/131* (2023.01)
*G09G 3/3233* (2016.01)

(52) U.S. Cl.
CPC ......... *H10K 59/131* (2023.02); *G09G 3/3233* (2013.01); *G09G 2300/0426* (2013.01);
(Continued)

(58) Field of Classification Search
CPC ......... G09G 3/3233; G09G 2300/0426; G09G 2300/0819; G09G 2300/0842;
(Continued)

(56) References Cited

U.S. PATENT DOCUMENTS

2016/0133173 A1   5/2016   Tsai et al.
2019/0064552 A1   2/2019   Kim et al.
(Continued)

FOREIGN PATENT DOCUMENTS

CN   104656331 A   5/2015
CN   109427854 A   3/2019
(Continued)

OTHER PUBLICATIONS

International Search Report & Written Opinion mailed Jul. 15, 2021, regarding PCT/CN2020/121755.
(Continued)

*Primary Examiner* — Stacy Khoo
(74) *Attorney, Agent, or Firm* — Intellectual Valley Law, P.C.

(57) ABSTRACT

An array substrate is provided. The array substrate includes a respective first anode electrically connected to a respective first light emitting element in a respective first subpixel; a respective second anode electrically connected to a respective second light emitting element in a respective second subpixel; a respective third anode electrically connected to a respective third light emitting element in a respective third subpixel; and a respective fourth anode electrically connected to a respective fourth light emitting element in a respective fourth subpixel. An orthographic projection of the respective third anode on a base substrate substantially covers an orthographic projection of the first initialization connecting line on the base substrate, and covers an ortho-
(Continued)

graphic projection of at least portion of the respective third voltage supply line on the base substrate.

20 Claims, 33 Drawing Sheets

(52) U.S. Cl.
CPC ............... *G09G 2300/0842* (2013.01); *G09G 2320/0242* (2013.01)

(58) Field of Classification Search
CPC ... G09G 2300/0861; G09G 2310/0251; G09G 2320/0242; H10K 59/131; H10K 59/8051; H10K 59/1216; H10K 59/126
See application file for complete search history.

(56) References Cited

U.S. PATENT DOCUMENTS

| | | |
|---|---|---|
| 2019/0206324 A1 | 7/2019 | Kim et al. |
| 2020/0227503 A1 | 7/2020 | Yi et al. |
| 2020/0294446 A1* | 9/2020 | Long ................. H10K 59/1201 |

FOREIGN PATENT DOCUMENTS

| | | |
|---|---|---|
| CN | 110690360 A | 1/2020 |
| CN | 111430408 A | 7/2020 |
| CN | 111739926 A | 10/2020 |
| KR | 20200077677 A * | 7/2020 |

OTHER PUBLICATIONS

Ex Parte Quayle Action in the U.S. Appl. No. 17/428,972, dated Apr. 12, 2023.

Response to Ex Parte Quayle Action in the U.S. Appl. No. 17/428,972, dated May 15, 2023.

Notice of Allowance in the U.S. Appl. No. 17/428,972, dated Jul. 26, 2023.

* cited by examiner

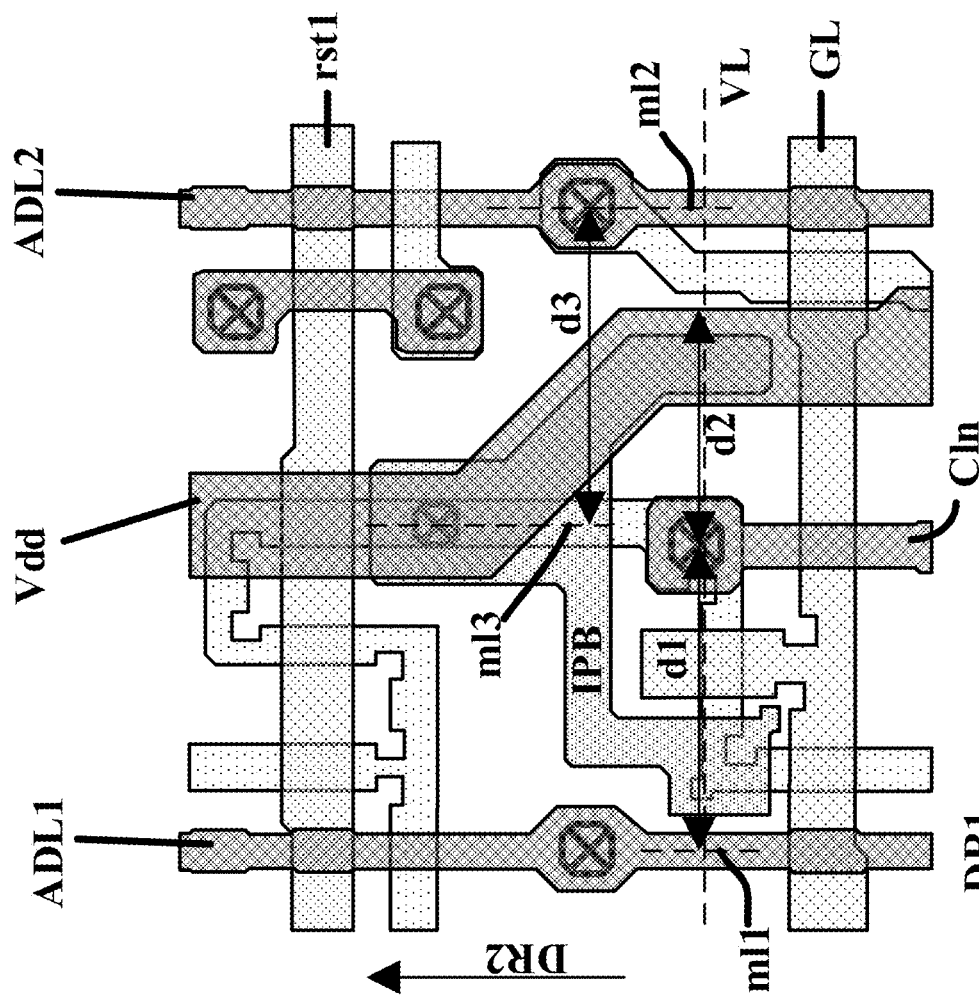
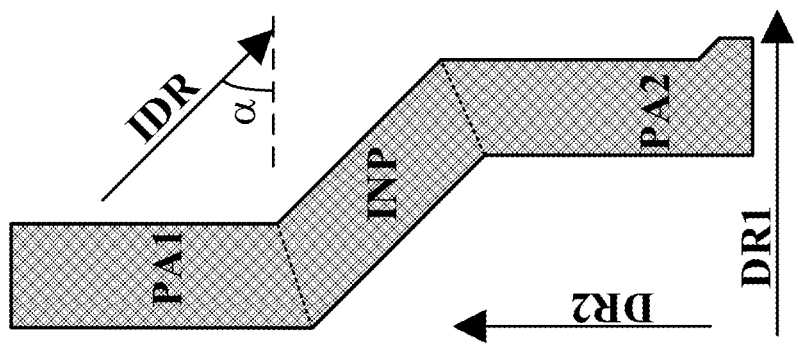
FIG. 5H
FIG. 5G

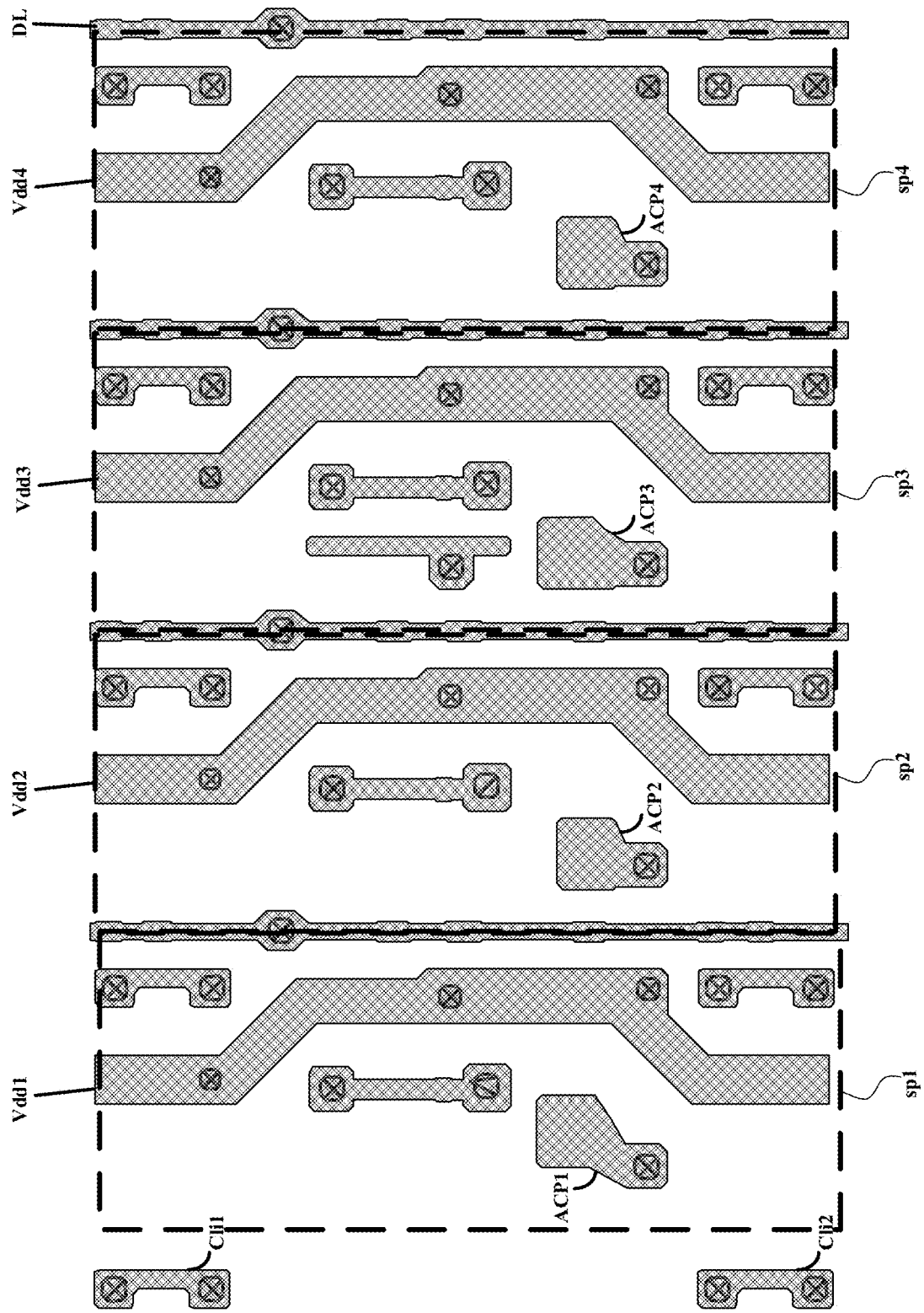

ARRAY SUBSTRATE AND DISPLAY APPARATUS

CROSS-REFERENCE TO RELATED APPLICATION

This application is a continuation-in-part of U.S. application Ser. No. 17/428,972, filed Oct. 19, 2020, which is a national stage application under 35 U.S.C. § 371 of International Application No. PCT/CN2020/121755, filed Oct. 19, 2020. Each of the forgoing applications is herein incorporated by reference in its entirety for all purposes.

TECHNICAL FIELD

The present invention relates to display technology, more particularly, to an array substrate and a display apparatus.

BACKGROUND

Organic Light Emitting Diode (OLED) display is one of the hotspots in the field of flat panel display research today. Unlike Thin Film Transistor-Liquid Crystal Display (TFT-LCD), which uses a stable voltage to control brightness, OLED is driven by a driving current required to be kept constant to control illumination. The OLED display panel includes a plurality of pixel units configured with pixel-driving circuits arranged in multiple rows and columns. Each pixel-driving circuit includes a driving transistor having a gate terminal connected to one gate line per row and a drain terminal connected to one data line per column. When the row in which the pixel unit is gated is turned on, the switching transistor connected to the driving transistor, is turned on, and the data voltage is applied from the data line to the driving transistor via the switching transistor, so that the driving transistor outputs a current corresponding to the data voltage to an OLED device. The OLED device is driven to emit light of a corresponding brightness.

SUMMARY

In one aspect, the present disclosure provides an array substrate, comprising a plurality of gate lines, a plurality of first reset control signal lines, a plurality of first reset signal lines, respectively extending along a first direction; a plurality of data lines and a plurality of voltage supply lines, respectively extending along a second direction; and a pixel driving circuit; wherein the pixel driving circuit comprises a driving transistor; a first transistor, and a storage capacitor; and the first transistor comprises a gate electrode connected to a respective one of the plurality of first reset control signal lines, a source electrode connected to a respective one of the plurality of first reset signal lines, and a drain electrode connected to a gate electrode of the driving transistor and a first capacitor electrode of the storage capacitor; wherein the array substrate comprises a first initialization connecting line connecting the respective one of the plurality of first reset signal lines and a source electrode of the first transistor in a respective one of a plurality of subpixels, the respective one of the plurality of first reset signal lines configured to provide a reset signal to the source electrode of the first transistor, through the first initialization connecting line; and the plurality of subpixels comprises a respective third subpixel; the array substrate further comprises a respective third voltage supply line in the respective third subpixel; and a respective third anode electrically connected to a respective third light emitting element in the respective third subpixel; wherein an orthographic projection of the respective third anode on a base substrate substantially covers an orthographic projection of the first initialization connecting line on the base substrate, and covers an orthographic projection of at least portion of the respective third voltage supply line on the base substrate.

Optionally, the plurality of subpixels further comprises a respective first subpixel, a respective second subpixel, and a respective fourth subpixel; the array substrate further comprises a respective first voltage supply line in the respective first subpixel; a respective second voltage supply line in the respective second subpixel; a respective fourth voltage supply line in the respective fourth subpixel; a respective first anode electrically connected to a respective first light emitting element in the respective first subpixel; a respective second anode electrically connected to a respective second light emitting element in the respective second subpixel; and a respective fourth anode electrically connected to a respective fourth light emitting element in the respective fourth subpixel.

Optionally, the first initialization connecting line is in a same layer as the plurality of data lines; the first initialization connecting line is connected to the respective one of the plurality of first reset signal lines through a via extending through an inter-layer dielectric layer; the first initialization connecting line is connected to the source electrode of the first transistor through a via extending through the inter-layer dielectric layer, an insulating layer, and a gate insulating layer; and the first initialization connecting line crosses over a respective one of the plurality of first reset control signal line.

Optionally, an active layer and the drain electrode of the first transistor are parts of a unitary structure in the respective one of the plurality of subpixels; at least a portion of the source electrode of the first transistor crosses over a respective one of the plurality of data lines; and an orthographic projection of the first initialization connecting line on a base substrate is spaced apart from orthographic projections of at least a portion of the active layer and at least a portion of the drain electrode of the first transistor on the base substrate by an orthographic projection of the respective one of the plurality of data lines on the base substrate.

Optionally, the array substrate further comprises a plurality of second reset control signal lines and a plurality of second reset signal lines, respectively extending along the first direction; wherein the pixel driving circuit further comprises a second transistor; a third transistor, a fourth transistor, a fifth transistor, and a sixth transistor; the sixth transistor comprises a gate electrode connected to a respective one of the plurality of second reset control signal lines, a source electrode connected to a respective one of the plurality of second reset signal lines, and a drain electrode connected to a drain electrode of the fifth transistor and an anode of a light emitting element; wherein the array substrate comprises a second initialization connecting line connecting the respective one of the plurality of second reset signal lines and the source electrode of the sixth transistor in the respective one of the plurality of subpixels, the respective one of the plurality of second reset signal lines is configured to provide a reset signal to the source electrode of the sixth transistor through the second initialization connecting line; the second initialization connecting line is connected to the respective one of the plurality of second reset signal lines through a via extending through the inter-layer dielectric layer; the second initialization connecting line is connected to the source electrode of the sixth transistor through a via extending through the inter-layer dielectric layer, the insulating layer, and the gate insulating layer; and the second initialization connecting line crosses over a respective one of the plurality of second reset control signal line.

Optionally, an active layer and the drain electrode of the sixth transistor are parts of a unitary structure in the respective one of a plurality of subpixels; the source electrode of the sixth transistor crosses over the respective one of the plurality of data lines; and an orthographic projection of the second initialization connecting line on the base substrate is spaced apart from orthographic projections of the active layer and the drain electrode of the sixth transistor on the base substrate by an orthographic projection of the respective one of the plurality of data lines on the base substrate.

Optionally, the storage capacitor comprises the first capacitor electrode, a second capacitor electrode electrically connected to a respective one of the plurality of voltage supply lines, and the insulating layer between the first capacitor electrode and the second capacitor electrode; wherein the array substrate comprises a semiconductor material layer on a base substrate; a node connecting line in a same layer as the respective one of the plurality of voltage supply lines, connected to the first capacitor electrode through a first via, and connected to the semiconductor material layer through a second via; and an interference preventing block in a same layer as the second capacitor electrode, the respective one of the plurality of voltage supply lines connected to the interference preventing block through a third via.

Optionally, at least a portion of the drain electrode of the first transistor and a portion of the semiconductor material layer at a position connecting to the node connecting line are arranged along a direction substantially parallel to the second direction.

Optionally, the pixel driving circuit further comprises a second transistor and a third transistor; the second transistor comprises a gate electrode connected to a respective one of the plurality of gate lines, a source electrode connected to a respective one of the plurality of data lines, and a drain electrode connected to a source electrode of the driving transistor; the third transistor comprises a gate electrode connected to the respective one of the plurality of gate lines, a source electrode connected to the first capacitor electrode and a gate electrode of the driving transistor, and a drain electrode connected to a drain electrode of the driving transistor; the portion of the semiconductor material layer at a position connecting to the node connecting line comprises at least a portion of the source electrode of the third transistor; the source electrode of the third transistor and the drain electrode of the first transistor are parts of a unitary structure in a respective one of a plurality of subpixels; and a portion of the unitary structure extends along a direction substantially parallel to the second direction.

Optionally, an orthographic projection of the interference preventing block on the base substrate substantially covers at least 80% of an orthographic projection of the drain electrode of the first transistor on the base substrate.

Optionally, the interference preventing block comprises a handle, a first arm and a second arm; the respective one of the plurality of voltage supply lines is connected to the handle through the third via; the first arm comprises a L-shaped portion and a first tip portion; the second arm comprises a base portion, a second tip portion, and a connecting portion connecting the base portion and the second tip portion; the base portion connects the L-shaped portion and the handle; and along the first direction, a portion of the node connecting line at a position connecting to the semiconductor material layer through the second via is spaced apart from a first adjacent data line by the first arm, and is spaced apart from a second adjacent data line by the second arm.

Optionally, a combination of an orthographic projection of the base portion of the second arm on the base substrate and an orthographic projection of the handle on the base substrate substantially covers at least 80% of the orthographic projection of the drain electrode of the first transistor on the base substrate.

Optionally, the pixel driving circuit further comprises a second transistor and a third transistor; the second transistor comprises a gate electrode connected to a respective one of the plurality of gate lines, a source electrode connected to a respective one of the plurality of data lines, and a drain electrode connected to a source electrode of the driving transistor; the third transistor comprises a gate electrode connected to the respective one of the plurality of gate lines, a source electrode connected to the first capacitor electrode and a gate electrode of the driving transistor, and a drain electrode connected to a drain electrode of the driving transistor; at least a portion of the drain electrode of the first transistor and the portion of the semiconductor material layer at a position connecting to the node connecting line are arranged along a direction substantially parallel a direction along which the handle and the base portion are arranged; and/or at least a portion of the source electrode of the third transistor and at least a portion of the drain electrode of the first transistor are arranged along a direction substantially parallel to the direction along which the handle and the base portion are arranged.

Optionally, the respective third voltage supply line comprises a main portion and a loop portion connected to the main portion; and the orthographic projection of the respective third anode on the base substrate at least partially overlaps with the orthographic projection of the first initialization connecting line on the base substrate, and at least partially overlap with an orthographic projection of the loop portion on the base substrate.

Optionally, an orthographic projection of a respective one of the plurality of data lines on the respective third anode is between an orthographic projection of the first initialization connecting line on the respective third anode and an orthographic projection of the loop portion on the respective third anode.

Optionally, the loop portion comprises a first loop sub-portion along a direction substantially parallel to the second direction, a second loop sub-portion substantially parallel to the first direction, and a third loop sub-portion substantially parallel to the first direction; the second loop sub-portion and the third loop sub-portion respectively connect the first loop sub-portion to the main portion of the respective third voltage supply line; the array substrate further comprises a loop hole extending through the respective third voltage supply line; and a perimeter of the loop hole is surrounded by a combination of the first loop sub-portion, the second loop sub-portion, the third loop sub-portion, and the main portion.

Optionally, the orthographic projection of the respective third anode on a base substrate at least partially overlaps with an orthographic projection of the first loop sub-portion on the base substrate; and an orthographic projection of a respective one of the plurality of data lines on the respective third anode is between an orthographic projection of the first initialization connecting line on the respective third anode and an orthographic projection of the first loop sub-portion on the respective third anode.

Optionally, signal lines are distributed underneath the respective third anode by having the first initialization connecting line underneath the respective third anode on a first side along a first edge of the respective third anode and the loop portion underneath the respective third anode on a second side along a second edge of the respective third anode; and the first side and the second side are opposite to each other.

Optionally, the first initialization connecting line is configured to provide the reset signal to the source electrode of the first transistor; and the loop portion is configured to provide a high voltage signal, which is transmitted to a second capacitor electrode of the storage capacitor in the respective third subpixel.

Optionally, a source electrode and an active layer of the third transistor are parts of a unitary structure in a respective one of a plurality of subpixels; the node connecting line is connected to the source electrode of the third transistor through the second via; and an orthographic projection of a respective one of the plurality of voltage supply lines on the base substrate at least partially overlaps with an orthographic projection of the second arm on the base substrate.

Optionally, a respective one of the plurality of voltage supply lines comprises a first parallel portion, a second parallel portion, and a first inclined portion connecting the first parallel portion and the second parallel portion along an inclined direction; the first parallel portion and the second parallel portion respectively extend along a direction substantially parallel to the second direction; the first inclined portion extends along an inclined angle with respect to the first direction; the handle and the base portion are arranged along a direction substantially parallel to the second direction; and the connecting portion extends along a direction substantially parallel to the inclined direction.

Optionally, an orthographic projection of the first inclined portion on a base substrate at least partially overlaps with an orthographic projection of the connecting portion on the base substrate; an orthographic projection of the first parallel portion on the base substrate at least partially overlaps with an orthographic projection of the handle on the base substrate; and an orthographic projection of the second parallel portion on the base substrate at least partially overlaps with an orthographic projection of the second tip portion on the base substrate; wherein the respective third voltage supply line further comprises a second inclined portion connected to the second parallel portion, and a third parallel portion connected to the second inclined portion; the third parallel portion extends along a direction substantially parallel to the second direction; the second inclined portion extends along a second inclined angle with respect to the first direction; the inclined angle and the second inclined angle are supplementary to each other; and an orthographic projection of the second inclined portion on the base substrate is non-overlapping with an orthographic projection of the connecting portion on the base substrate.

Optionally, the pixel driving circuit further comprises a second transistor and a third transistor; the second transistor comprises a gate electrode connected to a respective one of the plurality of gate lines, a source electrode connected to a respective one of the plurality of data lines, and a drain electrode connected to a source electrode of the driving transistor; the third transistor comprises a gate electrode connected to the respective one of the plurality of gate lines, a source electrode connected to the first capacitor electrode and a gate electrode of the driving transistor, and a drain electrode connected to a drain electrode of the driving transistor; a drain electrode of the first transistor and a source electrode of the third transistor are parts of a unitary structure in a respective one of a plurality of subpixels, at least a portion of the drain electrode of the first transistor directly connected to at least a portion of the source electrode of the third transistor; the node connecting line is connected to the source electrode of the third transistor through the second via; and an orthographic projection of at least a portion of the drain electrode of the first transistor on a base substrate at least partially overlaps with an orthographic projection of the handle on the base substrate, at least partially overlaps with an orthographic projection of the first parallel portion on the base substrate, and at least partially overlaps with an orthographic projection of the base portion on the base substrate.

Optionally, the array substrate further comprises a gate insulating layer on a side of the semiconductor material layer away from a base substrate, the first capacitor electrode being on a side of the gate insulating layer away from the base substrate; and an inter-layer dielectric layer on a side of the second capacitor electrode away from the insulating layer, the node connecting line and the plurality of voltage supply lines being on a side of the inter-layer dielectric layer away from the second capacitor electrode; wherein the first via is in a hole region in which a portion of the second capacitor electrode is absent, and extends through the inter-layer dielectric layer and the insulating layer, wherein an orthographic projection of the second capacitor electrode on a base substrate completely covers, with a margin, an orthographic projection of the first capacitor electrode on the base substrate except for the hole region; and the second via extends through the inter-layer dielectric layer, the insulating layer, and the gate insulating layer.

Optionally, the respective first voltage supply line, the respective second voltage supply line, the respective third voltage supply line, and the respective fourth voltage supply line are sequentially and consecutively arranged along a row direction; the respective first voltage supply line, the respective second voltage supply line, the respective fourth voltage supply line have substantially same shape; the respective third voltage supply line has a shape different from the respective first voltage supply line, the respective second voltage supply line, the respective fourth voltage supply line; the plurality of voltage supply lines comprises a plurality of repeating groups along the row direction; and a respective one of the plurality of repeating groups comprises the respective first voltage supply line, the respective second voltage supply line, the respective third voltage supply line, and the respective fourth voltage supply line are.

In another aspect, the present disclosure provides a display apparatus, comprising the array substrate described herein or fabricated by a method described herein, and an integrated circuit connected to the array substrate.

BRIEF DESCRIPTION OF THE FIGURES

The following drawings are merely examples for illustrative purposes according to various disclosed embodiments and are not intended to limit the scope of the present invention.

FIG. 5G illustrates a partial structure of a respective one of the plurality of voltage supply lines in some embodiments according to the present disclosure.

FIG. 5H illustrates structural relationships between an interference preventing block and surrounding components in some embodiments according to the present disclosure.

FIG. 10B is a diagram illustrating the structure of a signal line layer in a plurality of subpixels of an array substrate depicted in FIG. 10A.

DETAILED DESCRIPTION

Figure 1:
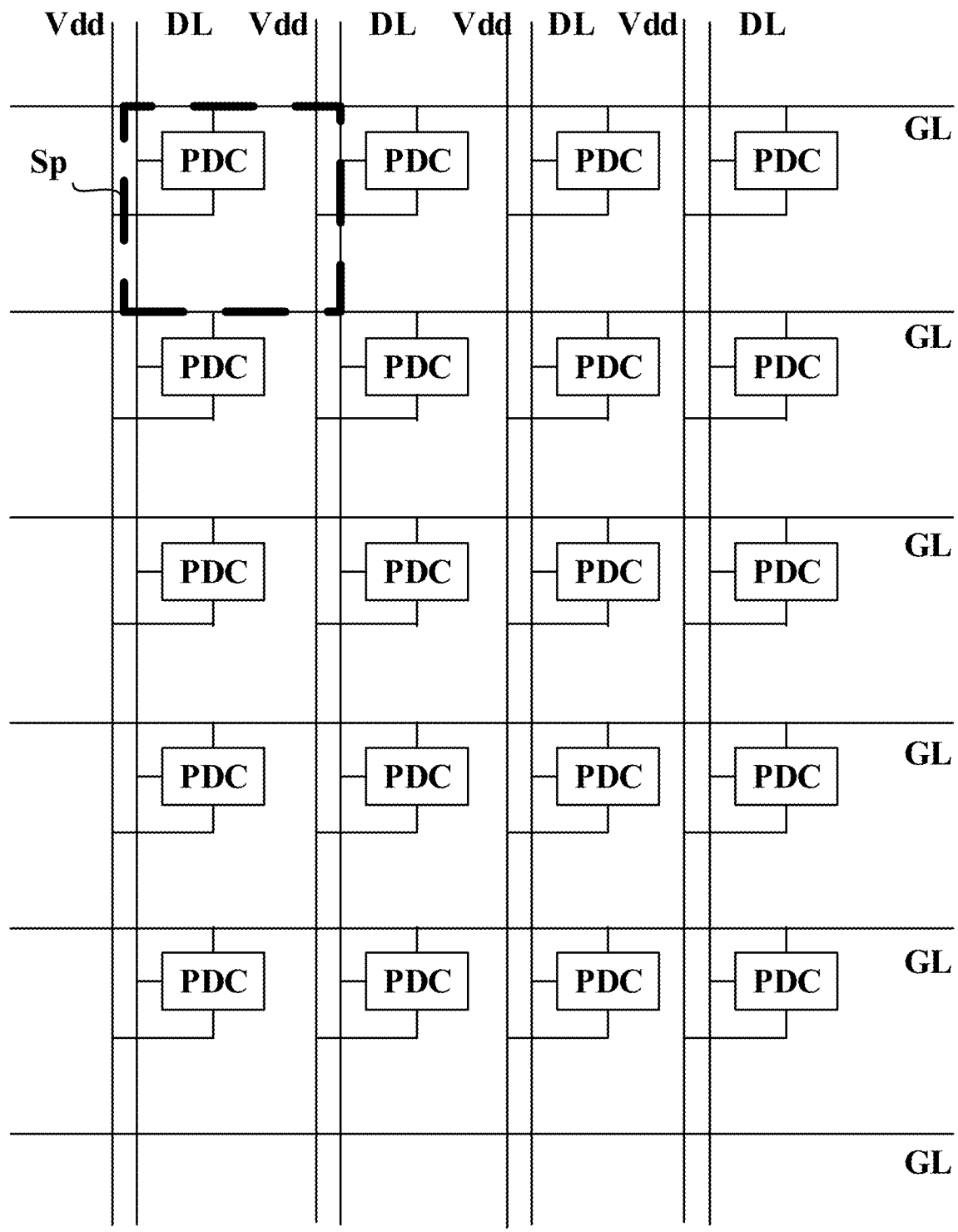
FIG. 1 is a plan view of an array substrate in some embodiments according to the present disclosure.

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, an array substrate and a display apparatus that substantially obviate one or more of the problems due to limitations and disadvantages of the related art. In one aspect, the present disclosure provides an array substrate. In some embodiments, the array substrate includes a plurality of gate lines, a plurality of first reset control signal lines, a plurality of first reset signal lines, respectively extending along a first direction; a plurality of data lines and a plurality of voltage supply lines, respectively extending along a second direction; and a pixel driving circuit. Optionally, the pixel driving circuit includes a driving transistor; a first transistor, and a storage capacitor. Optionally, the first transistor includes a gate electrode connected to a respective one of the plurality of first reset control signal lines, a source electrode connected to a respective one of the plurality of first reset signal lines, and a drain electrode connected to a gate electrode of the driving transistor and a first capacitor electrode of the storage capacitor. Optionally, the array substrate includes a first initialization connecting line connecting the respective one of the plurality of first reset signal lines and a source electrode of the first transistor in a respective one of a plurality of subpixels, the respective one of the plurality of first reset signal lines configured to provide a reset signal to the source electrode of the first transistor, through the first initialization connecting line. Optionally, the plurality of subpixels includes a respective first subpixel, a respective second subpixel, a respective third subpixel, and a respective fourth subpixel. Optionally, the array substrate further includes a respective first voltage supply line in the respective first subpixel; a respective second voltage supply line in the respective second subpixel; a respective third voltage supply line in the respective third subpixel; a respective fourth voltage supply line in the respective fourth subpixel; a respective first anode electrically connected to a respective first light emitting element in the respective first subpixel; a respective second anode electrically connected to a respective second light emitting element in the respective second subpixel; a respective third anode electrically connected to a respective third light emitting element in the respective third subpixel; and a respective fourth anode electrically connected to a respective fourth light emitting element in the respective fourth subpixel. Optionally, an orthographic projection of the respective third anode on a base substrate at least partially overlaps with an orthographic projection of the first initialization connecting line on the base substrate, and covers an orthographic projection of at least portion of the respective third voltage supply line on the base substrate.

FIG. 1 is a plan view of an array substrate in some embodiments according to the present disclosure. Referring to FIG. 1, the array substrate includes an array of subpixels Sp. Each subpixel includes an electronic component, e.g., a light emitting element. In one example, the light emitting element is driven by a pixel driving circuit PDC. The array substrate includes a plurality of gate lines GL, a plurality of data lines DL, a plurality of voltage supply lines Vdd (e.g., high voltage supply lines), and a plurality of low voltage supply lines (e.g., low voltage supply lines Vss). Light emission in a respective one of the subpixels Sp is driven by a pixel driving circuit PDC. In one example, a high voltage signal (e.g., a VDD signal) is input, through a respective one of the plurality of voltage supply lines Vdd, to the pixel driving circuit PDC connected to an anode of the light emitting element; a low voltage signal (e.g., a VSS signal) is input, through a respective one of the plurality of low voltage supply lines (e.g., a low voltage supply line Vss), to a cathode of the light emitting element. A voltage difference between the high voltage signal (e.g., the VDD signal) and the low voltage signal (e.g., the VSS signal) is a driving voltage ΔV that drives light emission in the light emitting element.

Various appropriate pixel driving circuits may be used in the present array substrate. Examples of appropriate driving circuits include 3T1C, 2T1C, 4T1C, 4T2C, 5T2C, 6T1C, 7T1C, 7T2C and 8T2C. In some embodiments, the respective one of the plurality of pixel driving circuits is a 7T1C driving circuit. Various appropriate light emitting elements may be used in the present array substrate. Examples of appropriate light emitting elements include organic light emitting diodes, quantum dots light emitting diodes, and micro light emitting diodes. Optionally, the light emitting element is micro light emitting diode. Optionally, the light emitting element is an organic light emitting diode including an organic light emitting layer.

Figure 2A:
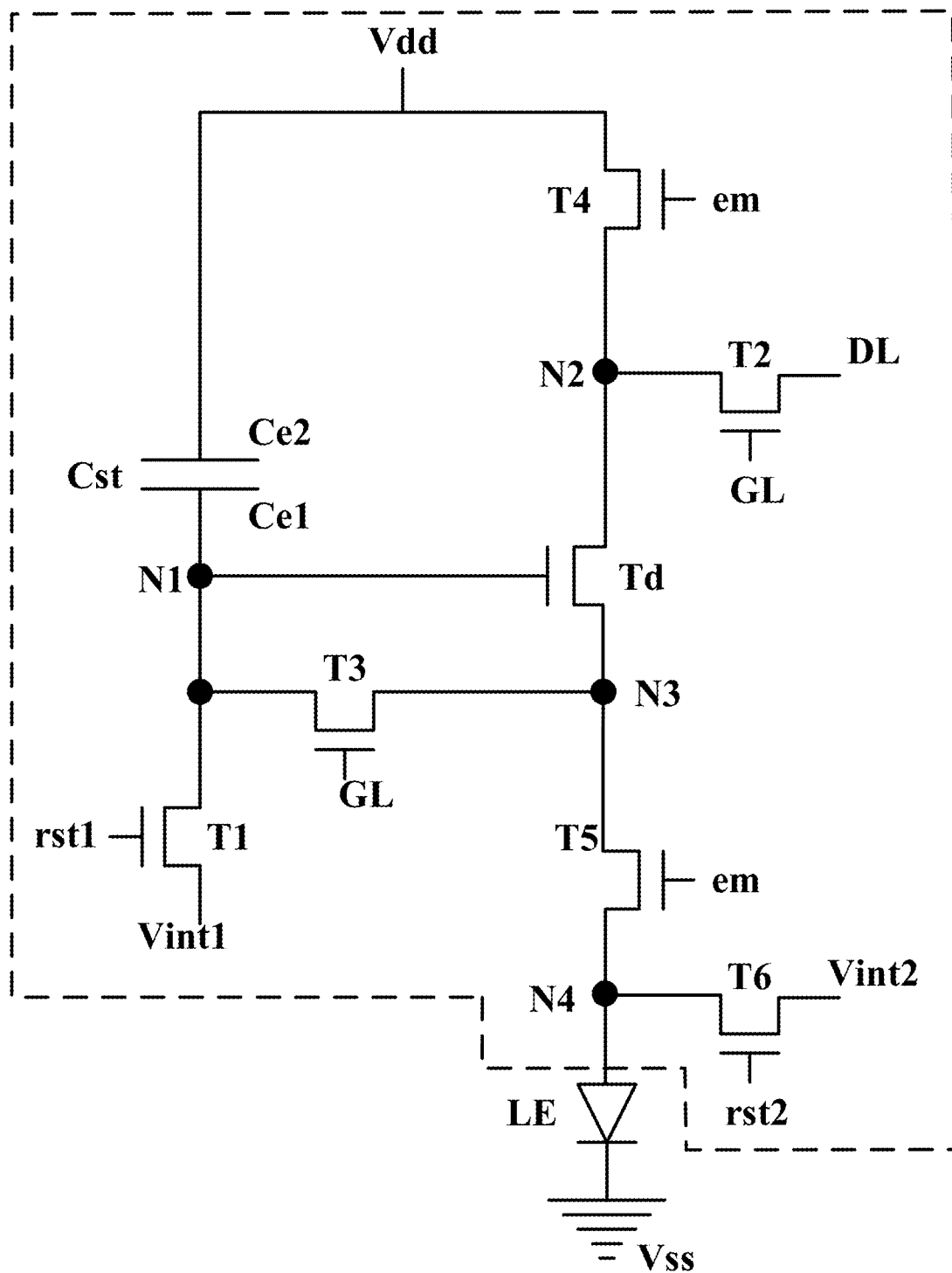
FIG. 2A is a circuit diagram illustrating the structure of a pixel driving circuit in some embodiments according to the present disclosure.

FIG. 2A is a circuit diagram illustrating the structure of a pixel driving circuit in some embodiments according to the present disclosure. Referring to FIG. 2, in some embodiments, the pixel driving circuit includes a driving transistor Td; a storage capacitor Cst having a first capacitor electrode Ce1 and a second capacitor electrode Ce2; a first transistor T1 having a gate electrode connected to a respective one of the plurality of first reset control signal lines rst1, a source electrode connected to a respective one of the plurality of first reset signal lines Vint1, and a drain electrode connected to a first capacitor electrode Ce1 of the storage capacitor Cst and a gate electrode of the driving transistor Td; a second transistor T2 having a gate electrode connected to a gate line GL, a source electrode connected to the data line DL, and a drain electrode connected to a source electrode of the driving transistor Td; a third transistor T3 having a gate electrode connected to the gate line GL, a source electrode connected to the first capacitor electrode Ce1 of the storage capacitor Cst and the gate electrode of the driving transistor Td, and a drain electrode connected to a drain electrode of the driving transistor Td; a fourth transistor T4 having a gate electrode connected to a respective one of the plurality of light emitting control signal lines em, a source electrode connected to the voltage supply line Vdd, and a drain electrode connected to the source electrode of the driving transistor Td and the drain electrode of the second transistor T2; a fifth transistor T5 having a gate electrode connected to the respective one of the plurality of light emitting control signal lines em, a source electrode connected to drain electrodes of the driving transistor Td and the third transistor T3, and a drain electrode connected to an anode of a light emitting element LE; and a sixth transistor T6 having a gate electrode connected to a respective one of the plurality of second reset control signal lines rst2, a source electrode connected to a respective one of the plurality of second reset signal lines Vint2, and a drain electrode connected to the drain electrode of the fifth transistor and the anode of the light emitting element LE. The second capacitor electrode Ce2 is connected to the voltage supply line Vdd and the source electrode of the fourth transistor T4.

The pixel driving circuit further include a first node N1, a second node N2, a third node N3, and a fourth node N4. The first node N1 is connected to the gate electrode of the driving transistor Td, the first capacitor electrode Ce1, and the source electrode of the third transistor T3. The second node N2 is connected to the drain electrode of the fourth transistor T4, the drain electrode of the second transistor T2, and the source electrode of the driving transistor Td. The third node N3 is connected to the drain electrode of the driving transistor Td, the drain electrode of the third transistor T3, and the source electrode of the fifth transistor T5. The fourth node N4 is connected to the drain electrode of the fifth transistor T5, the drain electrode of the sixth transistor T6, and the anode of the light emitting element LE.

Figure 2B:
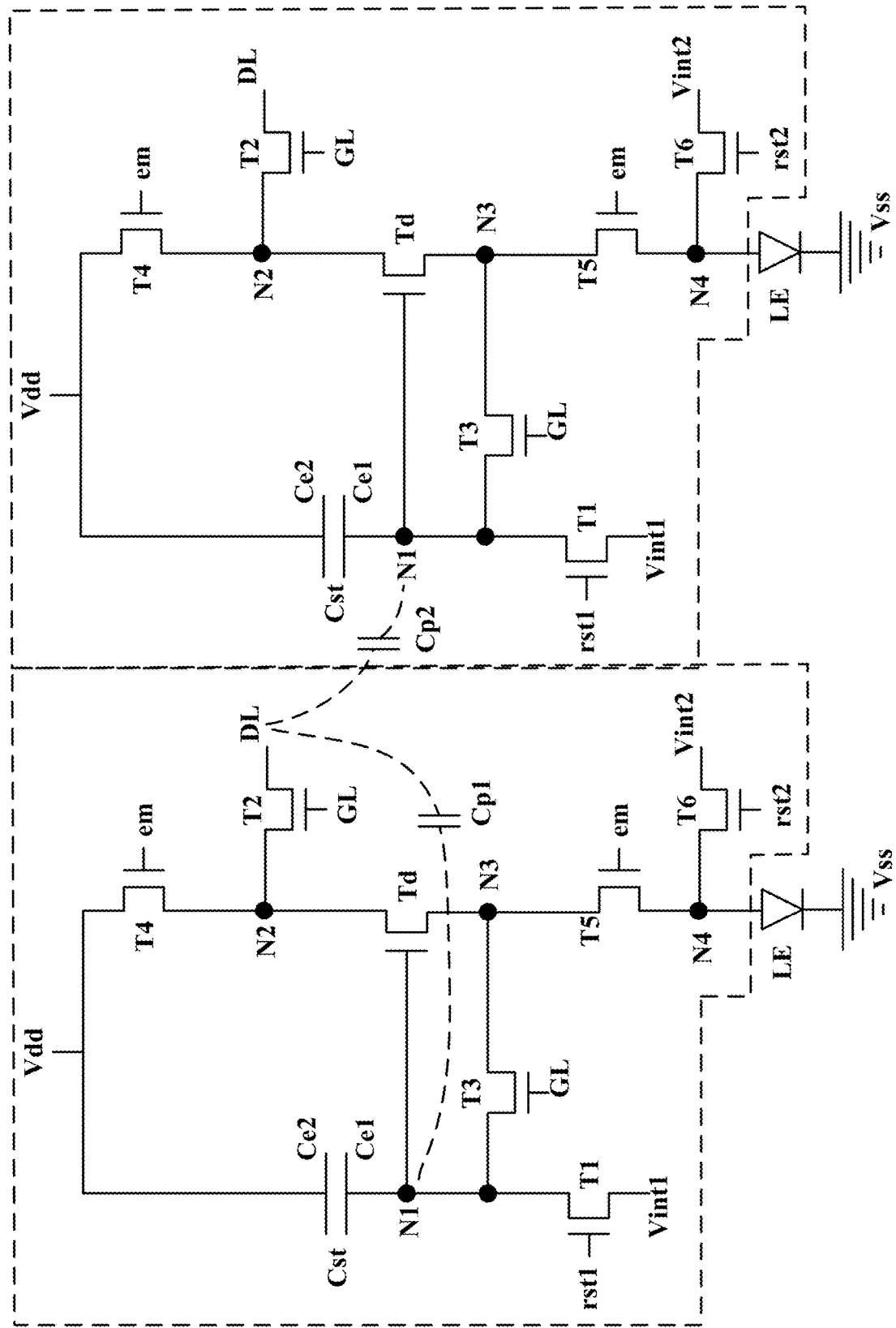
FIG. 2B illustrates a mechanism of preventing cross-talk in an array substrate in some embodiments according to the present disclosure.

FIG. 2B illustrates a mechanism of preventing cross-talk in an array substrate in some embodiments according to the present disclosure. Referring to FIG. 2B, the inventors of the present disclosure discover that presence of cross-talk between the N1 node and adjacent data lines affect display quality. The cross-talk between the N1 node and the adjacent data lines are indicated as parasitic capacitance Cp1 and Cp2 in FIG. 2B. The inventors of the present disclosure discover that, unexpected and surprisingly, an interference preventing block (which will be described in details in the present disclosure) can effectively reduce the cross-talk, particularly vertical cross-talk between the N1 node of the adjacent data lines.

Figure 3A:
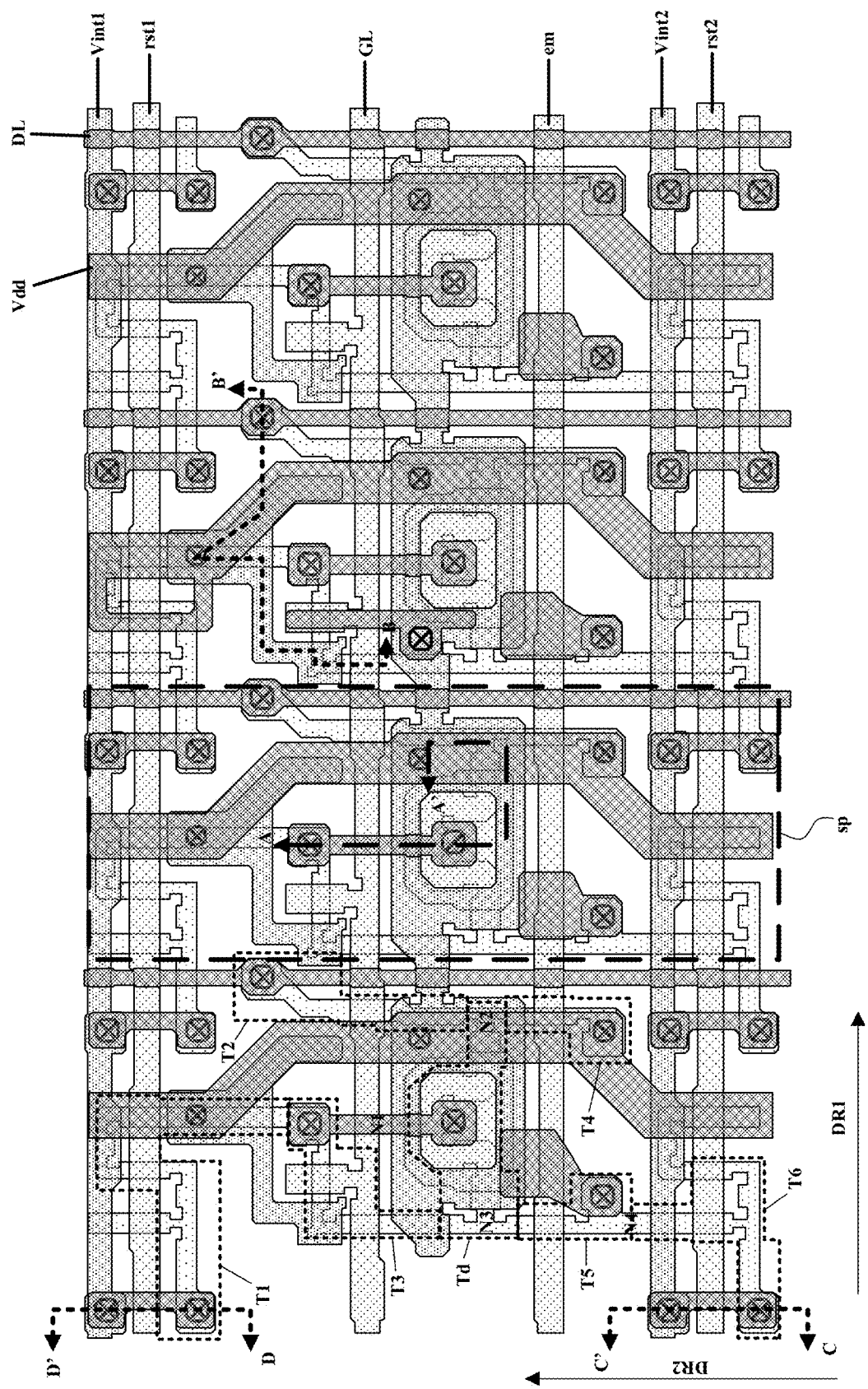
FIG. 3A is a diagram illustrating the structure of a plurality of subpixels of an array substrate in some embodiments according to the present disclosure.

FIG. 3A is a diagram illustrating the structure of a plurality of subpixels of an array substrate in some embodiments according to the present disclosure. Referring to FIG. 3A, the array substrate in some embodiments includes a plurality of subpixels (e.g., a red subpixel, a green subpixel, and a blue subpixel). The array substrate in some embodiments includes a plurality of gate lines GL respectively extending along a first direction DR1, a plurality of data lines DL respectively extending along a second direction DR2; and a plurality of voltage supply lines Vdd respectively extending along the second direction DR2. Optionally, the array substrate further includes a plurality of first reset control signal lines rst1 respectively extending along the first direction DR1; a plurality of second reset control signal lines rst2 respectively extending along the first direction DR1; a plurality of first reset signal lines Vint1 respectively extending along the first direction DR1; a plurality of second reset signal lines Vint2 respectively extending along the first direction DR1; and a plurality of light emitting control signal lines em respectively extending along the first direction DR1. Corresponding positions of the plurality of transistors in a pixel driving circuit are depicted in FIG. 3A. The pixel driving circuit includes the first transistor T1, the second transistor T2, the third transistor T3, the fourth transistor T4, the fifth transistor T5, the sixth transistor T6, and the driving transistor Td.

Figure 3B:
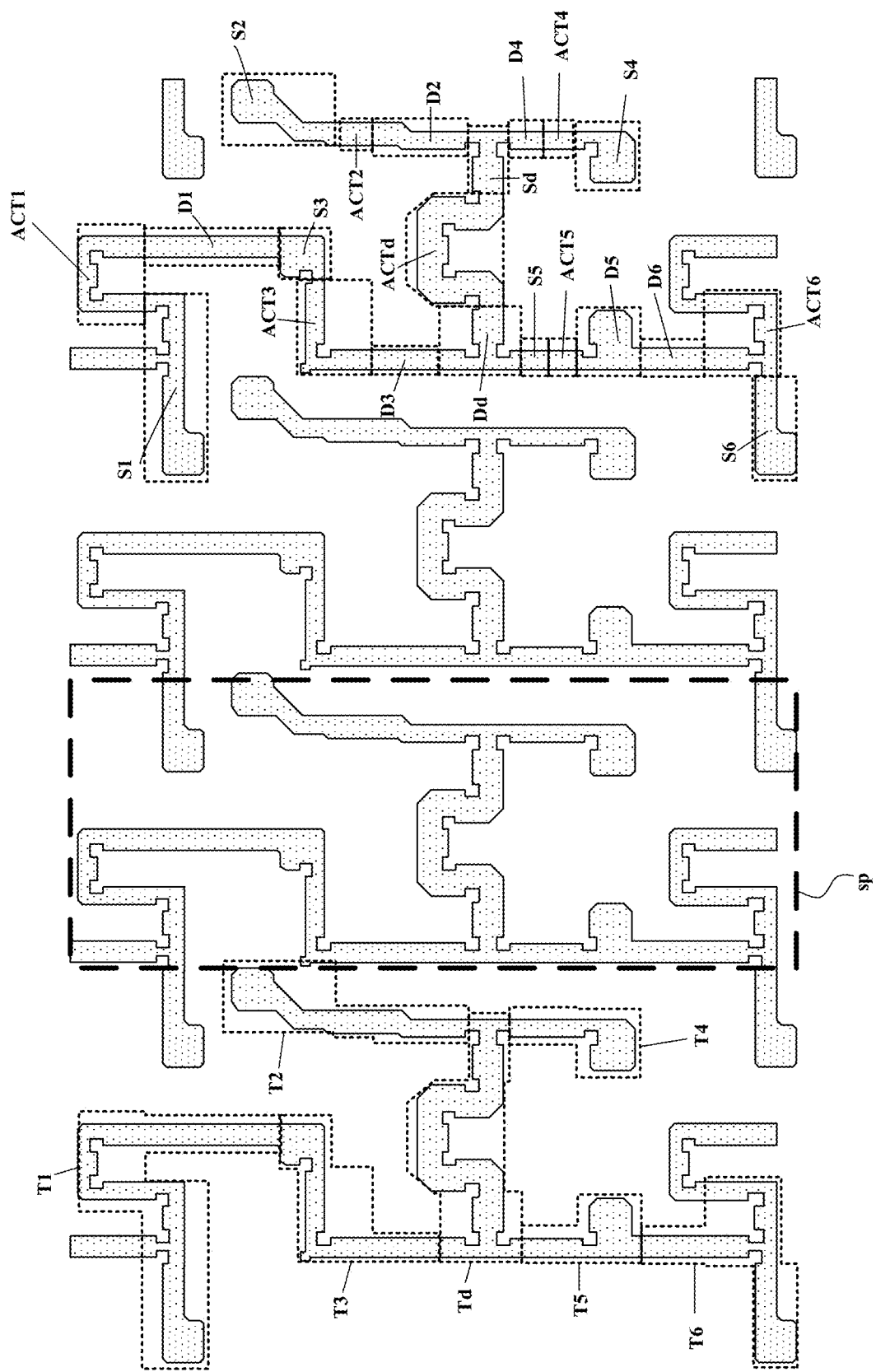
FIG. 3B is a diagram illustrating the structure of a semiconductor material layer in a plurality of subpixels of an array substrate depicted in FIG. 3A.
Figure 3C:
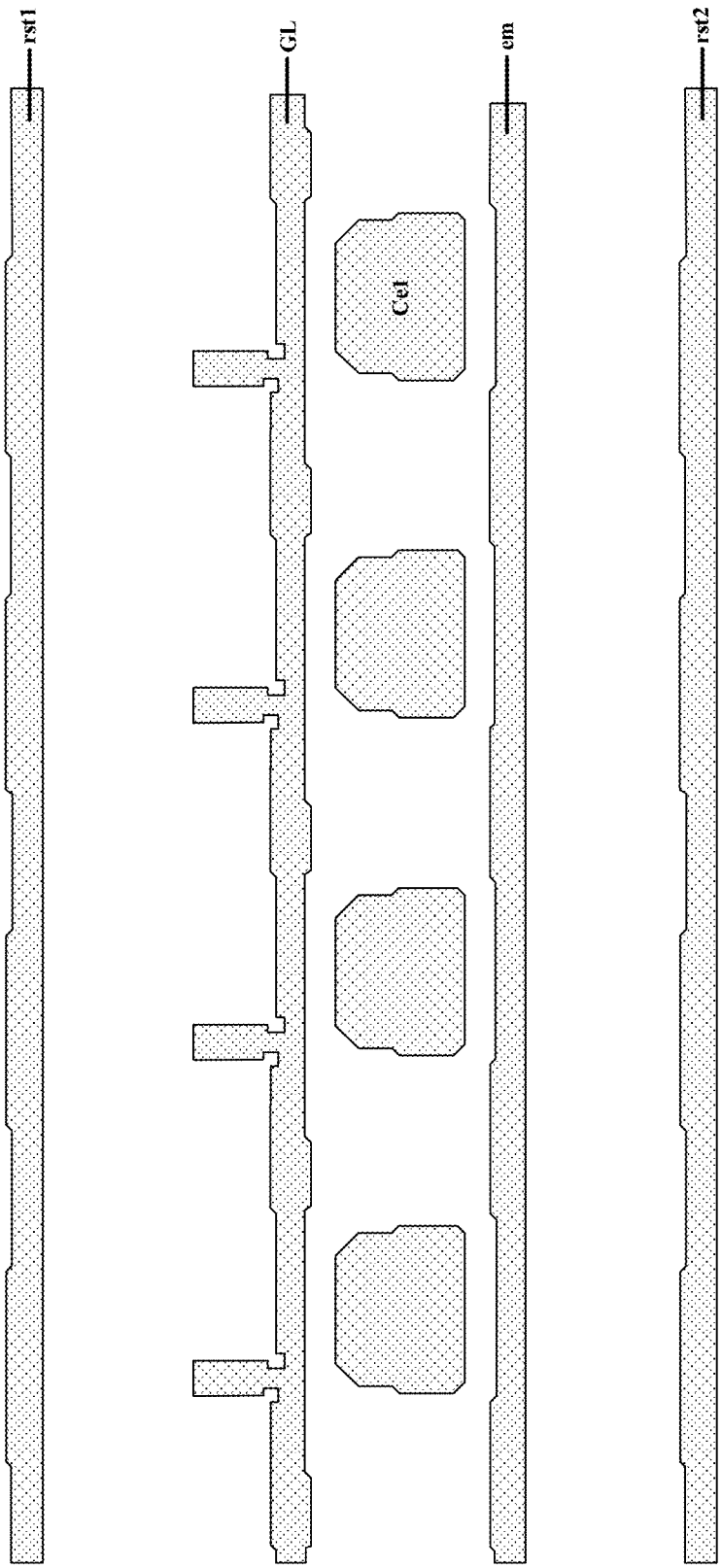
FIG. 3C is a diagram illustrating the structure of a first conductive layer in a plurality of subpixels of an array substrate depicted in FIG. 3A.
Figure 3D:
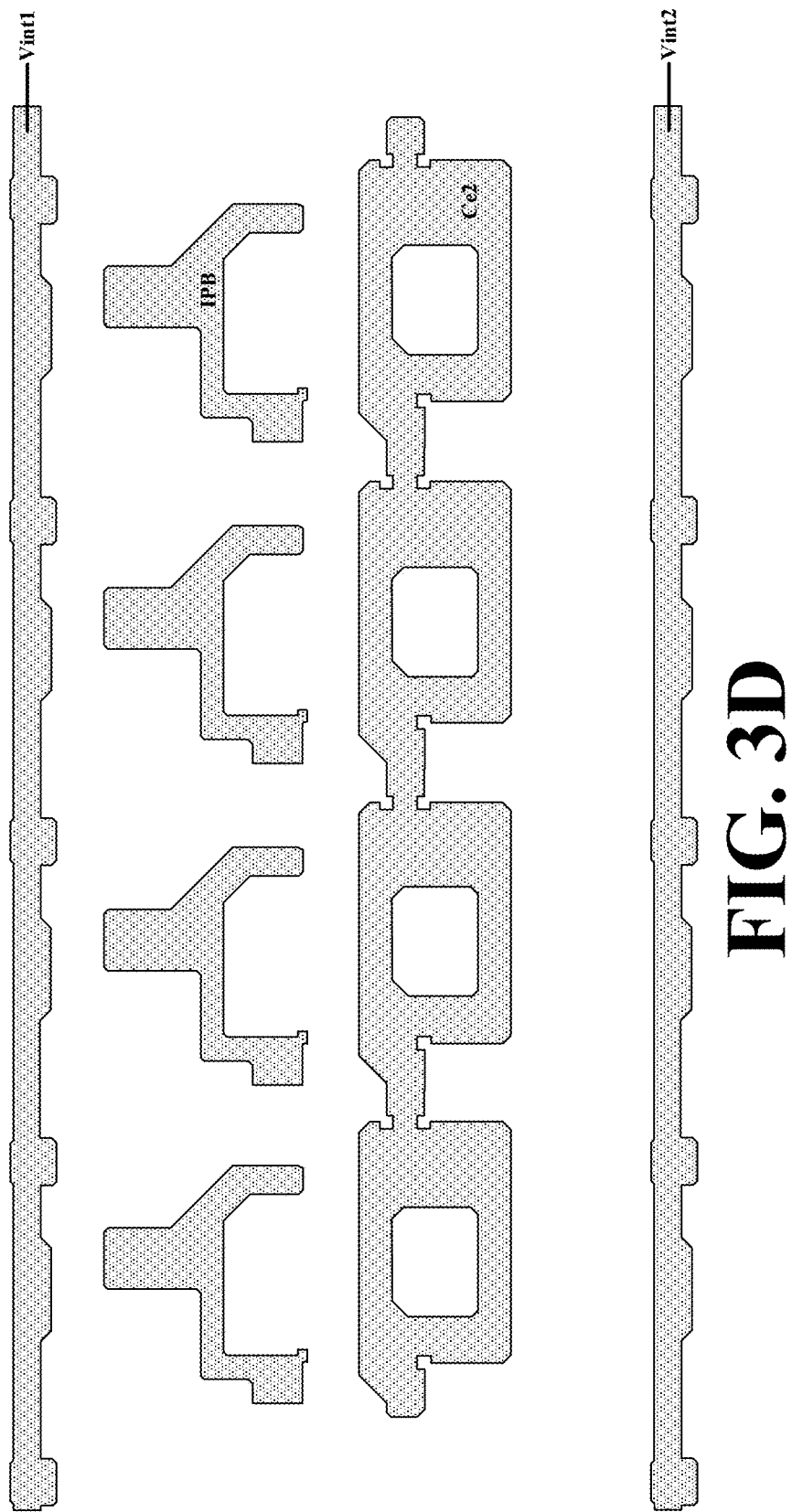
FIG. 3D is a diagram illustrating the structure of a second conductive layer in a plurality of subpixels of an array substrate depicted in FIG. 3A.
Figure 3E:
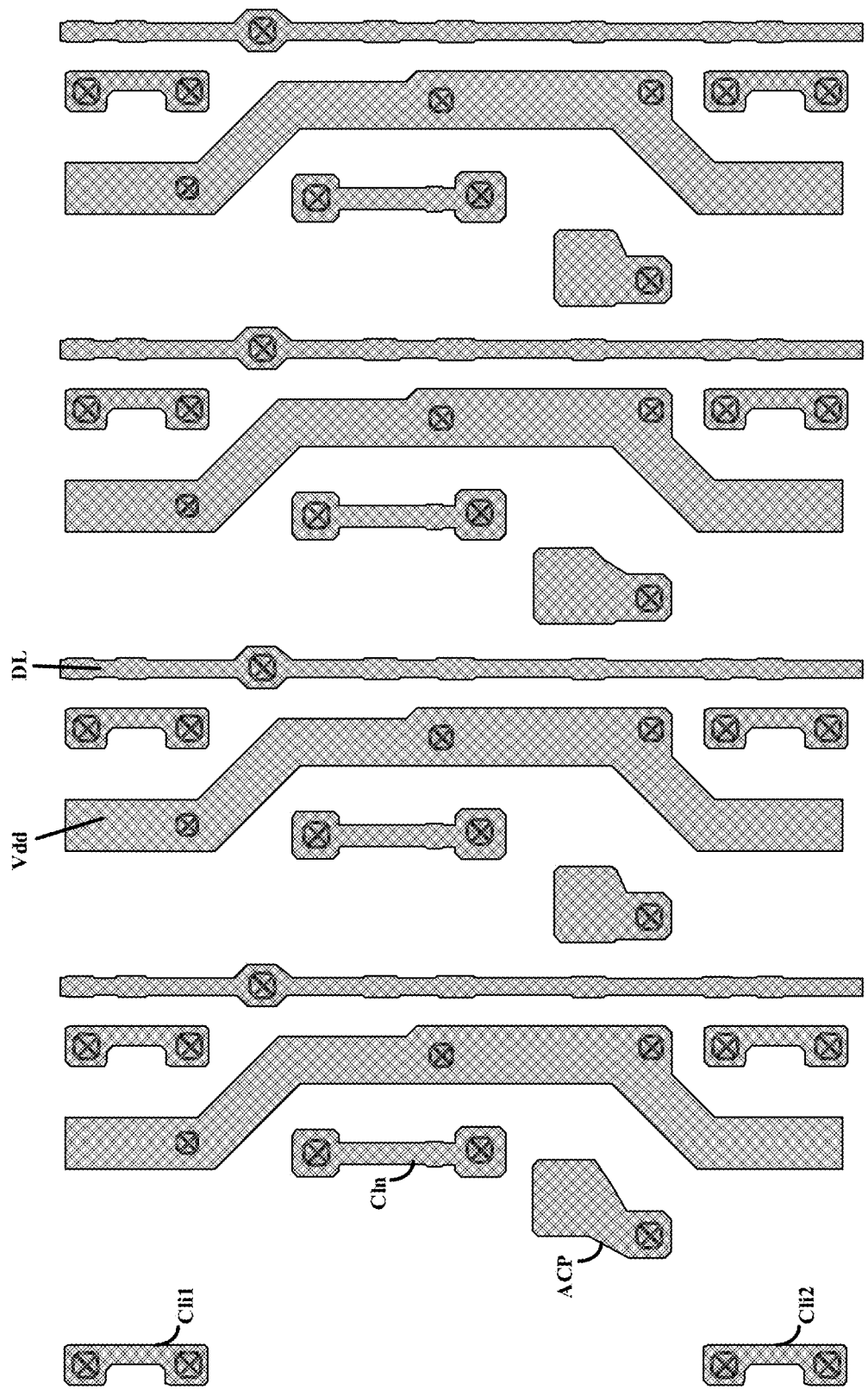
FIG. 3E is a diagram illustrating the structure of a signal line layer in a plurality of subpixels of an array substrate depicted in FIG. 3A.
Figure 4A:
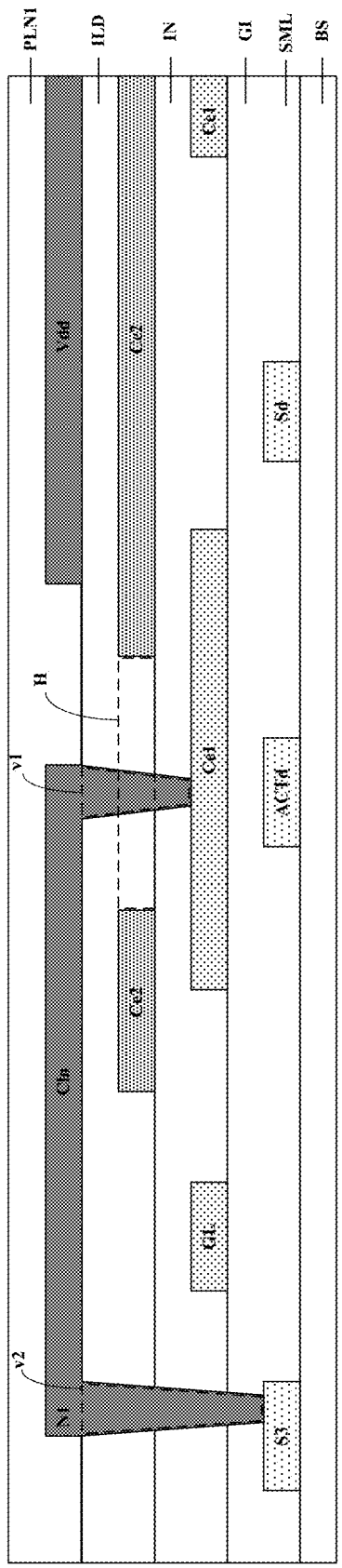
FIG. 4A is a cross-sectional view along an A-A' line in FIG. 3A.
Figure 4B:
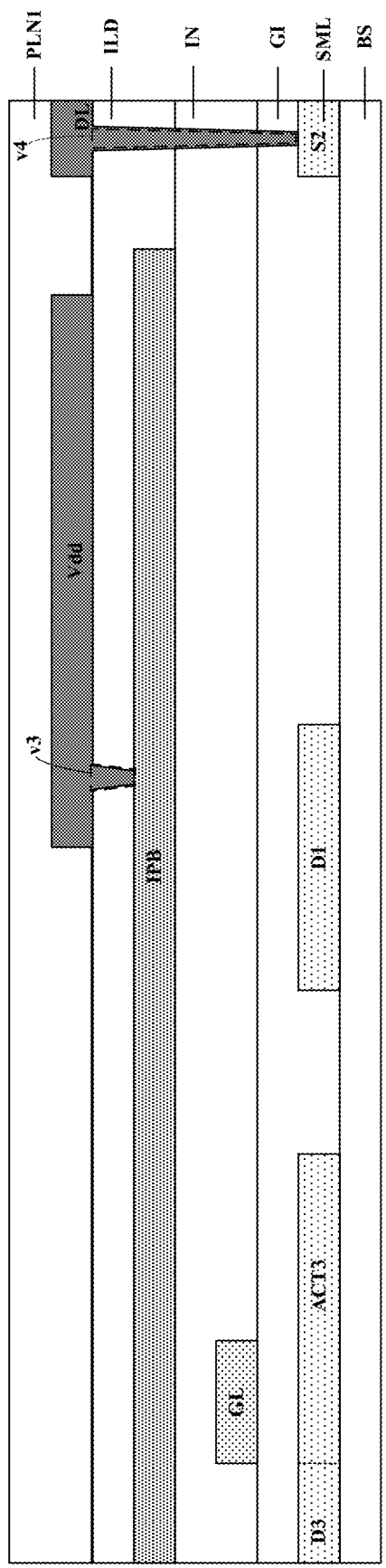
FIG. 4B is a cross-sectional view along a B-B' line in FIG. 3A.

FIG. 3B is a diagram illustrating the structure of a semiconductor material layer in a plurality of subpixels of an array substrate depicted in FIG. 3A. FIG. 3C is a diagram illustrating the structure of a first conductive layer in a plurality of subpixels of an array substrate depicted in FIG. 3A. FIG. 3D is a diagram illustrating the structure of a second conductive layer in a plurality of subpixels of an array substrate depicted in FIG. 3A. FIG. 3E is a diagram illustrating the structure of a signal line layer in a plurality of subpixels of an array substrate depicted in FIG. 3A. FIG. 4A is a cross-sectional view along an A-A' line in FIG. 3A. FIG. 4B is a cross-sectional view along a B-B' line in FIG. 3A. Referring to FIG. 3A to FIG. 3E, and FIG. 4A to FIG. 4B, in some embodiments, the array substrate includes a base substrate BS, a semiconductor material layer SML on the base substrate BS, a gate insulating layer GI on a side of the semiconductor material layer SML away from the base substrate BS, a first conductive layer on a side of the gate insulating layer GI away from the semiconductor material layer SML, an insulating layer IN on a side of the first conductive layer away from the gate insulating layer GI, a second conductive layer on a side of the insulating layer IN away from the first conductive layer, an inter-layer dielectric layer ILD on a side of the second conductive layer away from the insulating layer IN, a signal line layer on a side of the inter-layer dielectric layer ILD away from the second conductive layer, a first planarization layer PLN1 on a side of the signal line layer away from the inter-layer dielectric layer ILD.

Referring to FIG. 2A, FIG. 3A, and FIG. 3B, in some embodiments, in each subpixel, the semiconductor material layer has a unitary structure. In FIG. 3B, the first subpixel on the left is annotated with labels indicating regions corresponding to the plurality of transistors in the pixel driving circuit, including the first transistor T1, the second transistor T2, the third transistor T3, the fourth transistor T4, the fifth transistor T5, the sixth transistor T6, and the driving transistor Td. In FIG. 3B, the subpixel on the right is annotated with labels indicating components of each of the plurality of transistors in the pixel driving circuit. For example, the first transistor T1 includes an active layer ACT10, a source electrode S1, and a drain electrode D1. The second transistor T2 includes an active layer ACT2, a source electrode S2, and a drain electrode D2. The third transistor T3 includes an active layer ACT3, a source electrode S3, and a drain electrode D3. The fourth transistor T4 includes an active layer ACT4, a source electrode S4, and a drain electrode D4. The fifth transistor T5 includes an active layer ACT5, a source electrode S5, and a drain electrode D5. The sixth transistor T6 includes an active layer ACT6, a source electrode S6, and a drain electrode D6. The driving transistor Td includes an active layer ACTd, a source electrode Sd, and a drain electrode Dd. In one example, the active layers (ACT1, ACT2, ACT3, ACT4, ACT5, ACT6 and ACTd), the source electrodes (S1, S2, S3, S4, S5, S6, and Sd), and the drain electrodes (D1, D2, D3, D4, D5, D6, and Dd) of the transistors (T1, T2, T3, T4, T5, T6, and Td) in a respective subpixel are parts of a unitary structure in the respective subpixel. In another example, the active layers (ACT1, ACT2, ACT3, ACT4, ACT5, ACT6, and ACTd), the source electrodes (S1, S2, S3, S4, S5, S6, and Sd), and the drain electrodes (D1, D2, D3, D4, D5, D6, and Dd) of the transistors (T1, T2, T3, T4, T5, T6, and Td) are in a same layer.

Referring to FIG. 2A, FIG. 3A, FIG. 3C, FIG. 4A, and FIG. 4B, the first conductive layer in some embodiments includes a plurality of gate lines GL, a plurality of first reset control signal lines rst1, a plurality of light emitting control signal lines em, a plurality of second reset control signal lines rst2, and a first capacitor electrode Ce1 of the storage capacitor Cst. Various appropriate electrode materials and various appropriate fabricating methods may be used to make the first conductive layer. For example, a conductive material may be deposited on the substrate by a plasma-enhanced chemical vapor deposition (PECVD) process and patterned. Examples of appropriate conductive materials for making the first conductive layer include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the plurality of gate lines GL, the plurality of first reset control signal lines rst1, the plurality of light emitting control signal lines em, the plurality of second reset control signal lines rst2, and the first capacitor electrode Ce1 are in a same layer.

As used herein, the term "same layer" refers to the relationship between the layers simultaneously formed in the same step. In one example, the plurality of gate lines GL and the first capacitor electrode Ce1 are in a same layer when they are formed as a result of one or more steps of a same patterning process performed in a same layer of material. In another example, the plurality of gate lines GL and the first capacitor electrode Ce1 can be formed in a same layer by simultaneously performing the step of forming the plurality of gate lines GL, and the step of forming the first capacitor electrode Ce1. The term "same layer" does not always mean that the thickness of the layer or the height of the layer in a cross-sectional view is the same.

Referring to FIG. 2A, FIG. 3A, and FIG. 3D, the second conductive layer in some embodiments includes a plurality of first reset signal lines Vint1, a second capacitor electrode Ce2 of the storage capacitor Cst, an interference preventing block IPB, and a plurality of second reset signal lines Vint2. Various appropriate conductive materials and various appropriate fabricating methods may be used to make the second conductive layer. For example, a conductive material may be deposited on the substrate by a plasma-enhanced chemical vapor deposition (PECVD) process and patterned. Examples of appropriate conductive materials for making the second conductive layer include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the plurality of first reset signal lines Vint1, the plurality of second reset signal lines Vint2, the interference preventing block IPB, and the second capacitor electrode Ce2 are in a same layer.

Referring to FIG. 2A, FIG. 3A, FIG. 3B, and FIG. 3E, the signal line layer in some embodiments includes a plurality of voltage supply lines Vdd, a plurality of data lines DL, a node connecting line Cln, a first initialization connecting line Cli1, and a second initialization connecting line Cli2. The node connecting line Cln connects the first capacitor electrode Ce1 and the source electrode of the third transistor T3 in a respective subpixel together. The first initialization connecting line Cli1 connects a respective one of the plurality of first reset signal lines Vint1 and the source electrode of the first transistor T1 in a respective subpixel together. The second initialization connecting line Cli2 connects a respective one of the plurality of second reset signal lines Vint2 and the source electrode of the sixth transistor T6 in a respective subpixel together. The first signal line layer in some embodiments further includes an anode contact pad ACP in a respective one of the plurality of subpixels sp. The anode contact pad ACP connects a source electrode of the fifth transistor T5 in the respective one of the plurality of subpixels sp to an anode in the respective one of the plurality of subpixels sp. Various appropriate conductive materials and various appropriate fabricating methods may be used to make the signal line layer. For example, a conductive material may be deposited on the substrate by a plasma-enhanced chemical vapor deposition (PECVD) process and patterned. Examples of appropriate conductive materials for making the first signal line layer include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the plurality of voltage supply lines Vdd, the plurality of data lines DL, the node connecting line Cln, the first initialization connecting line Cli1, and the second initialization connecting line Cli2 are in a same layer.

Figure 4C:
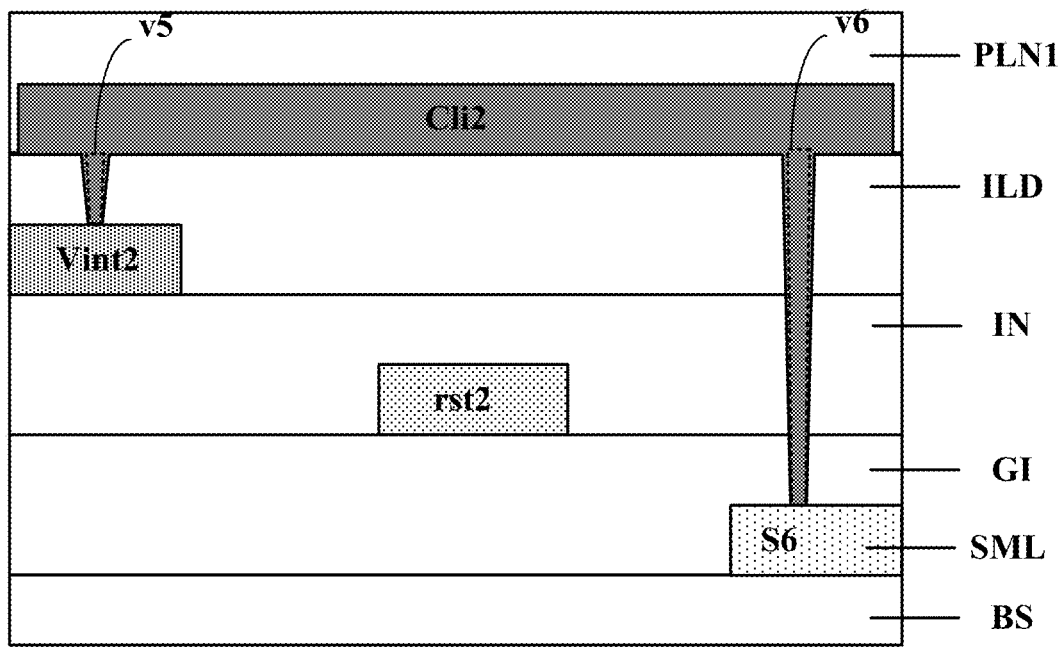
FIG. 4C is a cross-sectional view along a C-C' line in FIG. 3A.

FIG. 4C is a cross-sectional view along a C-C' line in FIG. 3A. Referring to FIG. 2A, FIG. 3A, FIG. 3E, and FIG. 4C, in some embodiments, the second initialization connecting line Cli2 connects the respective one of the plurality of second reset signal lines Vint2 and the source electrode S6 of the sixth transistor T6 in a respective subpixel together. The respective one of the plurality of second reset signal lines Vint2 is configured to provide a reset signal to the source electrode S6 of the sixth transistor T6 in the respective subpixel, through the second initialization connecting line Cli2. Optionally, the second initialization connecting line Cli2 is connected to the respective one of the plurality of second reset signal lines Vint2 through a fifth via v5 extending through the inter-layer dielectric layer ILD. Optionally, the second initialization connecting line Cli2 is connected to the source electrode S6 of the sixth transistor T6 in the respective subpixel through a sixth via v6 extending through the inter-layer dielectric layer ILD, the insulating layer IN, and the gate insulating layer GI.

Figure 4D:
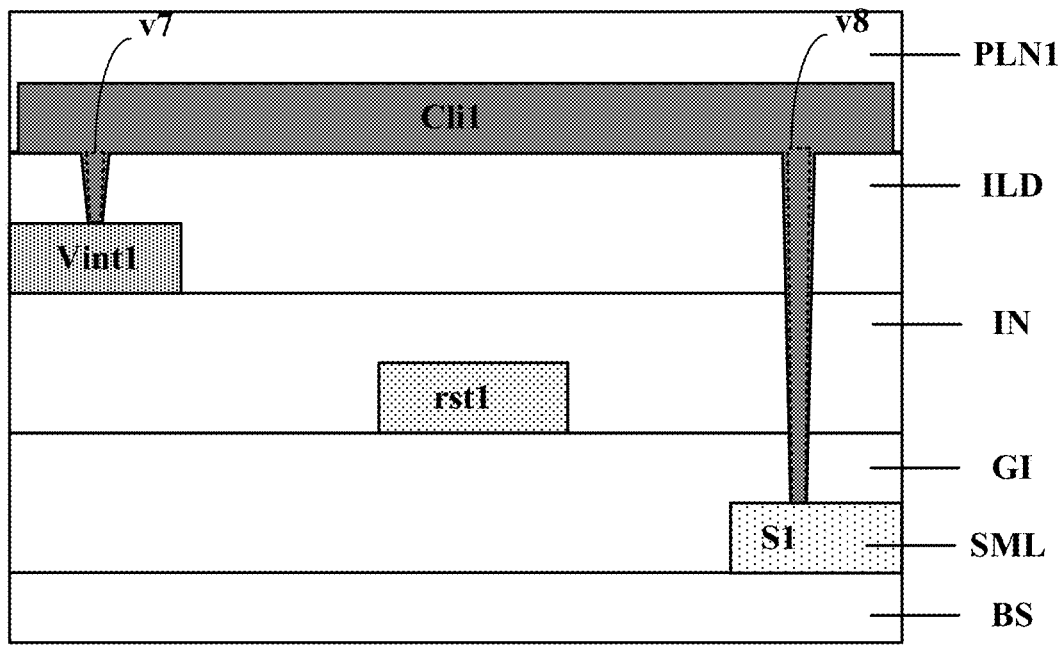
FIG. 4D is a cross-sectional view along a D-D' line in FIG. 3A.

FIG. 4D is a cross-sectional view along a D-D' line in FIG. 3A. Referring to FIG. 2A, FIG. 3A, FIG. 3E, and FIG. 4D, in some embodiments, the first initialization connecting line Cli1 connects the respective one of the plurality of first reset signal lines Vint1 and the source electrode S1 of the first transistor T1 in a respective subpixel together. The respective one of the plurality of first reset signal lines Vint1 is configured to provide a reset signal to the source electrode S1 of the first transistor T1 in the respective subpixel, through the first initialization connecting line Cli1. Optionally, the first initialization connecting line Cli1 is connected to the respective one of the plurality of first reset signal lines Vint1 through a seventh via v7 extending through the inter-layer dielectric layer ILD. Optionally, the first initialization connecting line Cli1 is connected to the source electrode S1 of the first transistor T1 in the respective subpixel through an eighth via v8 extending through the inter-layer dielectric layer ILD, the insulating layer IN, and the gate insulating layer GI.

Referring to FIG. 2A, FIG. 3A, FIG. 3C, FIG. 3D, and FIG. 4A, in some embodiments, an orthographic projection of the second capacitor electrode Ce2 on a base substrate BS completely covers, with a margin, an orthographic projection of the first capacitor electrode Ce1 on the base substrate BS except for a hole region H in which a portion of the second capacitor electrode Ce2 is absent. In some embodiments, the signal line layer includes a node connecting line Cln on a side of the inter-layer dielectric layer ILD away from the second capacitor electrode Ce2. The node connecting line Cln is in a same layer as the plurality of voltage supply lines Vdd and the plurality of data lines DL. Optionally, the array substrate further includes a first via v1 in the hole region H and extending through the inter-layer dielectric layer ILD and the insulating layer IN. Optionally, the node connecting line Cln is connected to the first capacitor electrode Ce1 through the first via v1. In some embodiments, the first capacitor electrode Ce1 is on a side of the gate insulating layer IN away from the base substrate BS. Optionally, the array substrate further includes a first via v1 and a second via v2. The first via v1 is in the hole region H and extends through the inter-layer dielectric layer ILD and the insulating layer IN. The second via v2 extends through the inter-layer dielectric layer ILD, the insulating layer IN, and the gate insulating layer GI. Optionally, the node connecting line Cln is connected to the first capacitor electrode Ce1 through the first via v1, and is connected node connecting line Cln is connected the semiconductor material layer SML through the second via v2. Optionally, the node connecting line Cln is connected to the source electrode S3 of third transistor, as depicted in FIG. 4A.

Referring to Referring to FIG. 2A, FIG. 3A, FIG. 3D, and FIG. 4B, in some embodiments, the interference preventing block IPB is in a same layer as the second capacitor electrode Ce2. The respective one of the plurality of voltage supply lines Vdd is connected to the interference preventing block IPB through a third via v3. Optionally, the third via v3 extends through the inter-layer dielectric layer ILD.

Referring to Referring to FIG. 2A, FIG. 3A, FIG. 3D, and FIG. 4B, in some embodiments, the plurality of data lines DL are in a same layer as the plurality of voltage supply lines Vdd. A respective one of the plurality of data lines DL is connected to a source electrode S2 of the second transistor through a fourth via v4. Optionally, the fourth via v4 extends through the inter-layer dielectric layer ILD, the insulating layer IN, and the gate insulating layer GI.

Figure 5A:
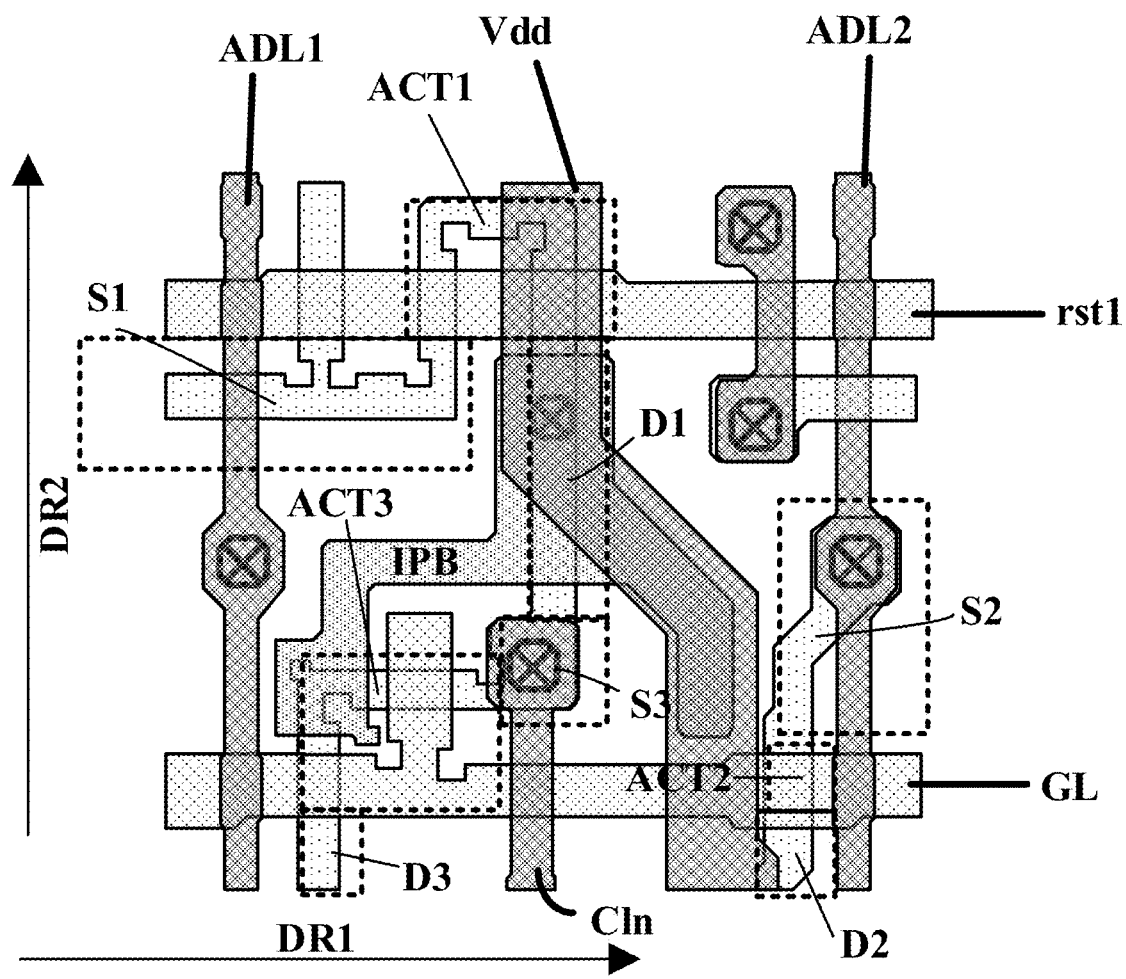
FIG. 5A is a partial view of a subpixel of an array substrate depicted in FIG. 3A.
Figure 5B:
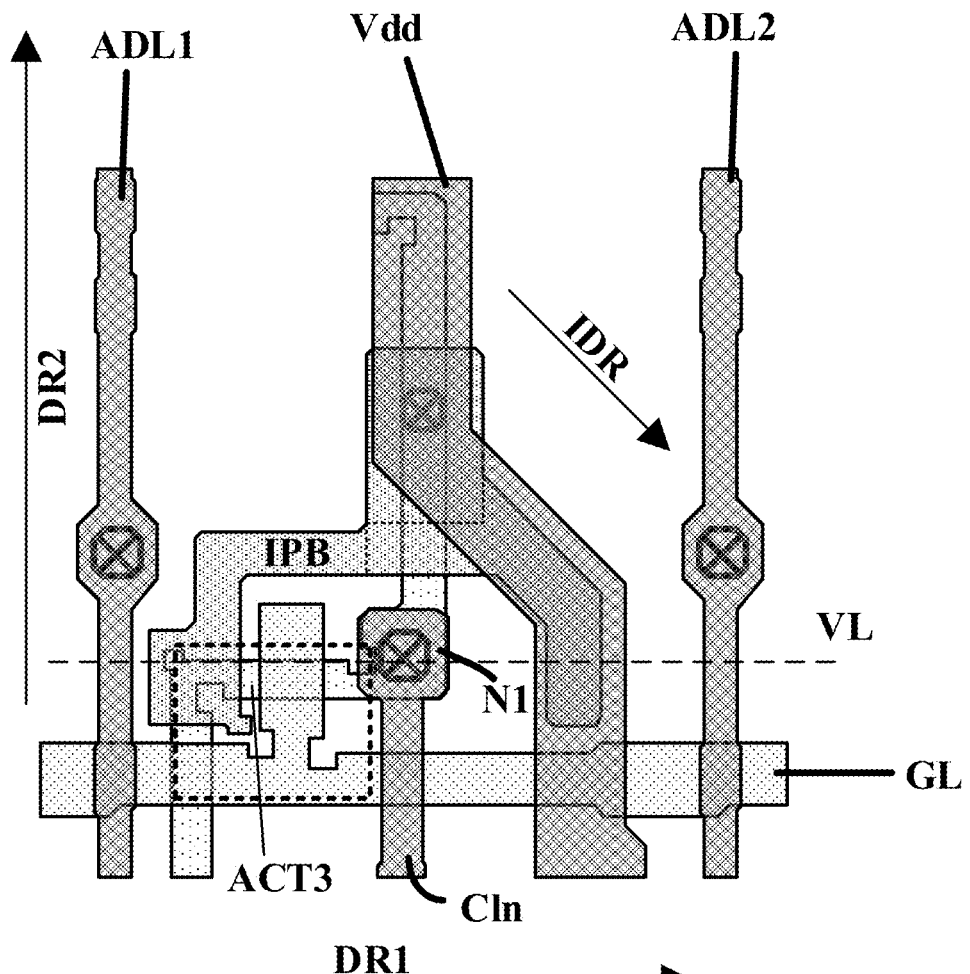
FIG. 5B show certain selected components of FIG. 5A.
Figure 5C:
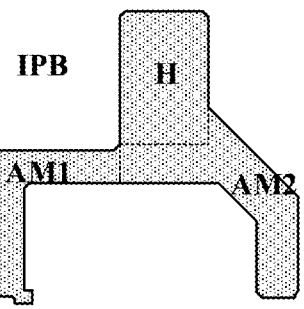
FIG. 5C illustrates the structure of an interference preventing block in some embodiments according to the present disclosure.

FIG. 5A is a partial view of a subpixel of an array substrate depicted in FIG. 3A. FIG. 5B show certain selected components of FIG. 5A. FIG. 5C illustrates the structure of an interference preventing block in some embodiments according to the present disclosure. Referring to FIG. 3A, FIG. 5A, FIG. 5B, and FIG. 5C, the interference preventing block IPB in some embodiments includes a first arm AM1 and a second arm AM2. As shown in FIG. 4A and FIG. 5B, a portion of the node connecting line Cln at a position connecting to the semiconductor material layer SML through the second via v2 may be denoted as the N1 node. Referring to FIG. 3A, FIG. 5A, and FIG. 5B, along the first direction DR1, the portion (e.g., the N1 node) of the node connecting line Cln at a position connecting to the semiconductor material layer SML through the second via v2 is spaced apart from a first adjacent data line ADL1 by the first arm AM1, and is spaced apart from a second adjacent data line ADL2 by the second arm AM2.

The inventors of the present disclosure discover that, unexpectedly and surprisingly, cross-talk between the N1 node and the adjacent data lines can be significantly reduced by having the interference preventing block IPB as described in the present disclosure. Table 1 below illustrates the unexpected and surprising reduction of cross-talk in an array substrate according to the present disclosure comparing to a control array substrate.

TABLE 1

Reduction of cross-talk between N1 node and adjacent data lines in an array substrate.

| | | An array substrate of the present disclosure | Control array substrate |
|---|---|---|---|
| Capacitance (fF) | N1 node~DL | 0.084 | 0.21 |
| | Cst | 40.65 | 38.06 |
| | Vdd~DL | 5.142 | 3.827 |
| | DL~N2 node | 0.113 | 0.116 |
| Crosstalk (under condition of a black data voltage of 6.5 V) | Vertical cross-talk | 0.672% | 1.630% |
| | Horizontal cross-talk | 0.832% | 0.838% |

In Table 1, "N1 node~DL" denotes a parasitic capacitance between the N1 node and an adjacent data line; "Cst" denotes the storage capacitance; "Vdd~DL" denotes a parasitic capacitance between a respective one of the plurality of voltage supply lines Vdd and an adjacent data line; "DL~N2 node" denotes a parasitic capacitance between the N2 node and an adjacent data line. The cross-talk data is measured under a condition of a black data voltage of 6.5 V provided to the plurality of data lines. As shown in Table 1, while the Vdd~DL increases with the interference preventing block IPB, the cross-talk (in particular the vertical cross-talk) can be significantly reduced, greatly improving display quality in a display panel having the present array substrate. Optionally, the vertical cross-talk is reduced, comparing the control array substrate, by at least 50%, e.g., at least 52%, at least 54%, at least 56%, at least 58%, or at least 60%. Optionally, the parasitic capacitance between the N1 node and an adjacent data line is reduced by at least 50%, e.g., at least 52%, at least 54%, at least 56%, at least 58%, or at least 60%. The slightly increased Vdd~DL can be easily compensated by a compensating integrated circuit.

Referring to FIG. 3A and FIG. 3B, in some embodiments, a source electrode S2 and an active layer ACT3 of the third transistor T3 are parts of a unitary structure in a respective one of a plurality of subpixels. Referring to FIG. 3A and FIG. 4A, in some embodiments, the node connecting line Cln is connected to the source electrode S3 of the third transistor T3 through the second via v2. Referring to FIG. 3A, FIG. 3B, FIG. 4A, and FIG. 5A to FIG. 5C, in some embodiments, an orthographic projection of the first arm AM1 on a base substrate BS at least partially overlaps with an orthographic projection of the active layer ACT3 of third transistor T3 on the base substrate BS.

As used herein, the active layer refers to a component of the transistor comprising at least a portion of the semiconductor material layer whose orthographic projection on the base substrate overlaps with an orthographic projection of a gate electrode on the base substrate. As used herein, a source electrode refers to a component of the transistor connected to one side of the active layer, and a drain electrode refers to a component of the transistor connected to another side of the active layer. In the context of a double-gate type transistor (for example, the third transistor T3), the active layer refers to a component of the transistor comprising a first portion of the semiconductor material layer whose orthographic projection on the base substrate overlaps with an orthographic projection of a first gate on the base substrate, a second portion of the semiconductor material layer whose orthographic projection on the base substrate overlaps with an orthographic projection of a second gate on the base substrate, and a third portion between the first portion and the second portion. In the context of a double-gate type transistor, a source electrode refers to a component of the transistor connected to a side of the first portion distal to the third portion, and a drain electrode refers to a component of the transistor connected to a side of the second portion distal to the third portion.

Figure 2C:
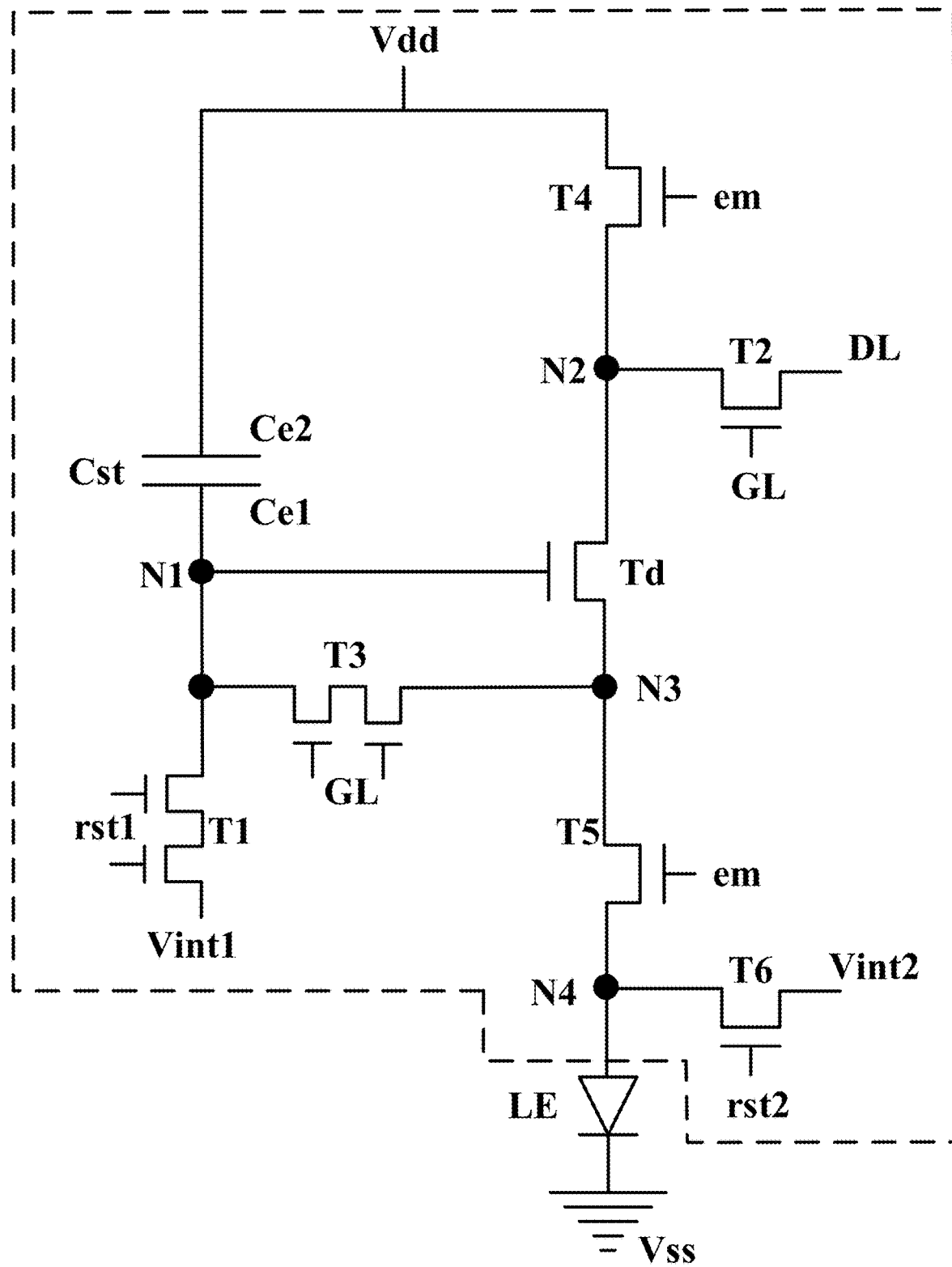
FIG. 2C is a circuit diagram illustrating the structure of a pixel driving circuit in some embodiments according to the present disclosure.
Figure 5D:
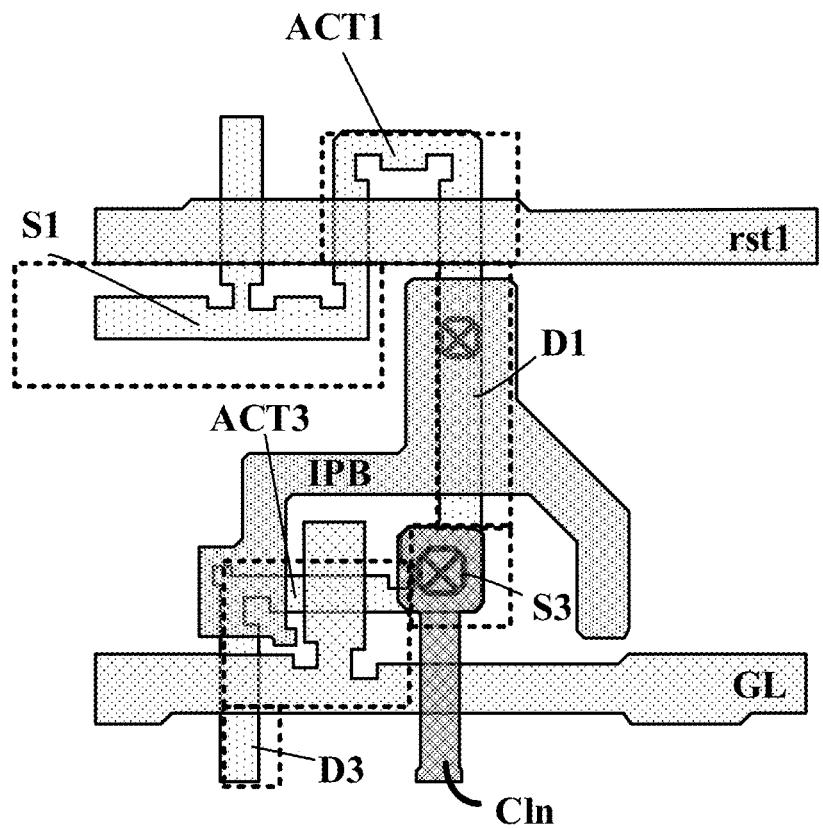
FIG. 5D is a zoom-in view of a region of an array substrate having a first transistor and a third transistor in some embodiments according to the present disclosure.
Figure 5E:
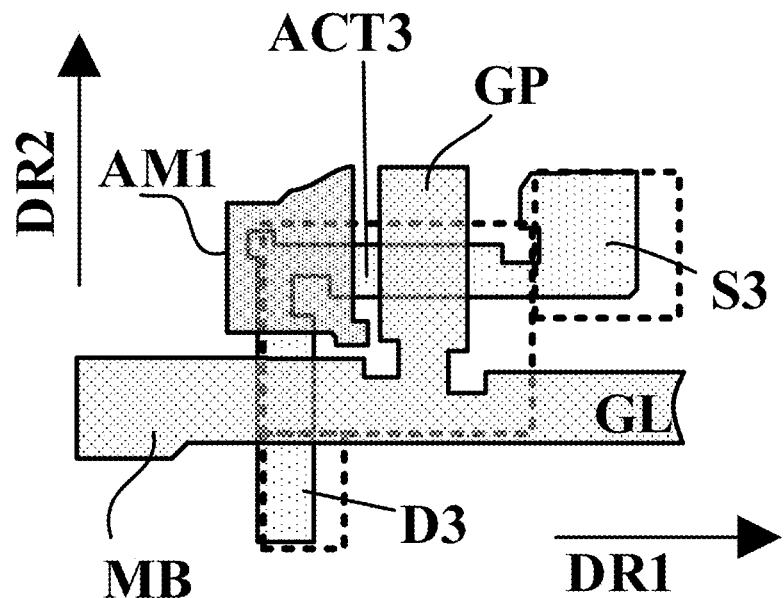
FIG. 5E is a further zoom-in view of a region of an array substrate having a third transistor in some embodiments according to the present disclosure.

FIG. 2C is a circuit diagram illustrating the structure of a pixel driving circuit in some embodiments according to the present disclosure. Referring to FIG. 2C, FIG. 3A, FIG. 3B, and FIG. 3C, in some embodiments, the third transistor T3 is a "double gate" transistor, and the first transistor T1 is a "double gate" transistor. FIG. 5D is a zoom-in view of a region of an array substrate having a first transistor and a third transistor in some embodiments according to the present disclosure. Referring to FIG. 5D, the active layer ACT1 of the first transistor T1 in some embodiments crosses over a respective one of the plurality of first reset control signal lines rst1 twice (alternatively, the respective one of the plurality of first reset control signal lines rst1 crosses over the active layer ACT1 of the first transistor T1 twice). Similarly, in some embodiments, the active layer ACT3 of the third transistor T3 in some embodiments crosses over a respective one of the plurality of gate lines GL twice (alternatively, the respective one of the plurality of gate lines GL crosses over the active layer ACT3 of the third transistor T3 twice). FIG. 5E is a further zoom-in view of a region of an array substrate having a third transistor in some embodiments according to the present disclosure. Referring to FIG. 5E, in some embodiments, the respective one of the plurality of gate lines GL includes a main body MB extending along the first direction DR1 and a protrusion GP protruding from the main body MB along the second direction DR2. As shown in FIG. 5E, the active layer ACT3 of the third transistor T3 crosses over the main body MB once and crosses over the protrusion GP once. The active layer ACT3 of the third transistor T3 includes a first portion that crosses over the protrusion GP, a second portion that crosses over the main body MB, and a third portion connecting the first portion and the second portion, the third portion does not crosses over any part of the respective one of the plurality of gate lines GL. As shown in FIG. 5E, the orthographic projection of the first arm AM1 on a base substrate at least partially overlaps with an orthographic projection of the third portion of the active layer ACT3 of third transistor T3 on the base substrate. Optionally, the third portion has a quasi L shape.

Referring to FIG. 3A, FIG. 3B, FIG. 4A, and FIG. 5A to FIG. 5C, in some embodiments, an orthographic projection of the second arm AM2 on a base substrate BS at least partially overlaps with an orthographic projection of a respective one of the plurality of voltage supply lines Vdd on the base substrate BS. Optionally, the orthographic projection of a respective one of the plurality of voltage supply lines Vdd on the base substrate BS at least partially overlaps with (e.g., substantially covers) the orthographic projection of the second arm AM2 on a base substrate BS. As used herein, the term "substantially covers" refers to one orthographic projection being at least 50 percent, at least 60 percent, at least 70 percent, at least 80 percent, at least 90 percent, at least 95 percent, at least 99 percent, or 100 percent covered by another orthographic projection.

Figure 5F:
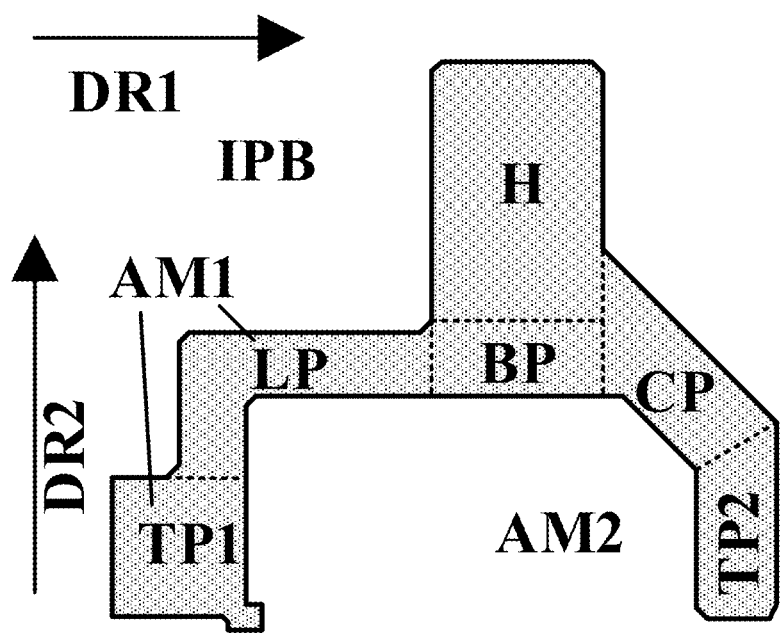
FIG. 5F illustrates a detailed structure of an interference preventing block in some embodiments according to the present disclosure.

FIG. 5F illustrates a detailed structure of an interference preventing block in some embodiments according to the present disclosure. Referring to FIG. 3A, FIG. 4B, FIG. 5A to FIG. 5E, the interference preventing block IPB in some embodiments further includes a handle H. The respective one of the plurality of voltage supply lines Vdd is connected to the handle H through the third via v3. Optionally, the first arm AM1 includes a L-shaped portion LP and a first tip portion TP1. Optionally, the second arm AM2 includes a base portion BP, a second tip portion TP2, and a connecting portion CP connecting the base portion BP and the second tip portion TP2. Optionally, the base portion BP connects the L-shaped portion LP and the handle H.

Optionally, the handle H has a substantially rectangular shape. Optionally, the base portion BP has a substantially rectangular shape. Optionally, the L-shaped portion has a quasi-L shape. Optionally, the first tip portion TP1 has a quasi rectangular shape.

Optionally, an orthographic projection of the first tip portion TP1 on a base substrate BS at least partially overlaps with an orthographic projection of the active layer ACT3 of third transistor T3 on the base substrate BS, whereas an orthographic projection of the L-shaped portion LP is non-overlapping with the orthographic projection of the active layer ACT3 of third transistor T3 on the base substrate BS.

As used herein, the active layer refers to a component of the transistor comprising at least a portion of the semiconductor material layer whose orthographic projection on the base substrate overlaps with an orthographic projection of a gate electrode on the base substrate. As used herein, a source electrode refers to a component of the transistor connected to one side of the active layer, and a drain electrode refers to a component of the transistor connected to another side of the active layer. In the context of a double-gate type transistor (for example, the third transistor T3), the active layer refers to a component of the transistor comprising a first portion of the semiconductor material layer whose orthographic projection on the base substrate overlaps with an orthographic projection of a first gate on the base substrate, a second portion of the semiconductor material layer whose orthographic projection on the base substrate overlaps with an orthographic projection of a second gate on the base substrate, and a third portion between the first portion and the second portion. In the context of a double-gate type transistor, a source electrode refers to a component of the transistor connected to a side of the first portion distal to the third portion, and a drain electrode refers to a component of the transistor connected to a side of the second portion distal to the third portion.

FIG. 5G illustrates a partial structure of a respective one of the plurality of voltage supply lines in some embodiments according to the present disclosure. Referring to FIG. 5G, a respective one of the plurality of voltage supply lines Vdd in some embodiments includes a first parallel portion PA1, a second parallel portion PA2, and a first inclined portion INP connecting the first parallel portion PA1 and the second parallel portion PA2 along an inclined direction IDR. The first parallel portion PA1 and the second parallel portion PA2 respectively extend along a direction substantially parallel to the second direction DR2. The first inclined portion INP extends along an inclined angle α with respect to the first direction DR1. The connecting portion INP extends along a direction substantially parallel to the inclined direction IDR. Referring to FIG. 5F, in some embodiments, the handle H and the base portion BP are arranged along a direction substantially parallel to the second direction DR2. As used herein, the term "substantially parallel" means that an angle is in the range of 0 degree to approximately 45 degrees, e.g., 0 degree to approximately 5 degrees, 0 degree to approximately 10 degrees, 0 degree to approximately 15 degrees, 0 degree to approximately 20 degrees, 0 degree to approximately 25 degrees, 0 degree to approximately 30 degrees.

Referring to FIG. 5A to FIG. 5G, in some embodiments, an orthographic projection of the first inclined portion INP on a base substrate BS at least partially overlaps with (e.g., substantially covers) an orthographic projection of the connecting portion CP on the base substrate BS. Optionally, an orthographic projection of the first parallel portion PA1 on the base substrate BS at least partially overlaps with an orthographic projection of the handle H on the base substrate BS. Optionally, an orthographic projection of the second parallel portion PA2 on the base substrate BS at least partially overlaps with (e.g., substantially covers) an orthographic projection of the second tip portion TP2 on the base substrate BS.

Referring to FIG. 2A, FIG. 3A, and FIG. 3B, in some embodiments, a drain electrode D1 of the first transistor T1 and a source electrode S3 of the third transistor T3 are parts of a unitary structure in a respective one of a plurality of subpixels sp. The drain electrode D1 of the first transistor T1 directly connected to the source electrode S3 of the third transistor T3. Referring to FIG. 4A, the node connecting line Cln in some embodiments is connected to the source electrode S3 of the third transistor T3 through the second via v2. Referring to FIG. 3A, FIG. 4A, FIG. 5A to FIG. 5G, in some embodiments, an orthographic projection of the drain electrode D1 of the first transistor T1 on a base substrate BS at least partially overlaps with an orthographic projection of the handle H on the base substrate BS, at least partially overlaps with an orthographic projection of the first parallel portion PA1 on the base substrate BS, and at least partially overlaps with an orthographic projection of the base portion BP on the base substrate BS.

Referring to FIG. 3A, FIG. 4A, FIG. 5A to FIG. 5G, in some embodiments, an orthographic projection of the portion (e.g., the N1 node depicted FIG. 5B) of the node connecting line Cln at the position connecting to the semiconductor material layer SML through the second via v2 on a base substrate BS is substantially surrounded by a combination of an orthographic projection of the interference preventing block IPB on the base substrate BS and an orthographic projection of a respective one of the plurality of gate lines GL on the base substrate BS. Optionally, an orthographic projection of the interference preventing block IPB on the base substrate BS is surrounded by a combination of an orthographic projection of the first adjacent data line ADL1 on the base substrate BS, an orthographic projection of the second adjacent data line ADL2 on the base substrate BS, an orthographic projection of the respective one of the plurality of first reset control signal lines rst1 on the base substrate BS, and an orthographic projection of the respective one of the plurality of gate lines GL on the base substrate BS. As used herein the term "substantially surrounded" refers to at least 50% (e.g., at least 60%, at least 70%, at least 80%, at least 90%, at least 95%, at least 99%, and 100%) of a perimeter of an area is surrounded.

Referring to FIG. 5B, a virtual line VL crossing over the portion (e.g., the N1 node depicted FIG. 5B) of the node connecting line Cln at the position connecting to the semiconductor material layer through the second via and substantially parallel to the first direction DR1 also crosses over the interference preventing block IPB, the first adjacent data line ADL1, and the second adjacent data line ADL2. Referring to FIG. 5B to FIG. 5G, in some embodiments, the virtual line VL crosses over the active layer ACT3 of third transistor T3, the interference preventing block IPB, the first adjacent data line ADL1, and the second adjacent data line ADL2. Optionally, the virtual line VL crosses over the first tip portion TP1, the second tip portion TP2, the first adjacent data line ADL1, and the second adjacent data line ADL2.

FIG. 5H illustrates structural relationships between an interference preventing block and surrounding components in some embodiments according to the present disclosure. FIG. 5H shows a first shortest distance d1, along the virtual line VL, between the portion (e.g., the N1 node depicted FIG. 5B) of the node connecting line Cln at the position connecting to the semiconductor material layer through the second via and a first center line ml1, along the second direction DR2, of the first adjacent data line ADL1. FIG. 5H further shows a second shortest distance d2, along the virtual line VL, between the portion (e.g., the N1 node depicted FIG. 5B) of the node connecting line Cln at the position connecting to the semiconductor material layer through the second via and an edge of the second parallel portion PA2 on a side closer to the second adjacent data line ADL2. FIG. 5H further shows a third shortest distance d3 between a second center line ml2, along the second direction DR2, of the second adjacent data line ADL2 and a third center line ml3, along the second direction DR2, of the handle H.

Optionally, the first shortest distance d1 is in a range of 14.5 μm to 16.5 μm, e.g., 14.5 μm to 15.0 μm, 15.0 μm to 15.5 μm, 15.5 μm to 16.0 μm, or 16.0 μm to 16.5 μm. Optionally, the second shortest distance d2 is in a range of 12.5 μm to 14.5 μm, e.g., 12.5 μm to 13.0 μm, 13.0 μm to 13.5 μm, 13.5 μm to 14.0 μm, or 14.0 μm to 14.5 μm. Optionally, the third shortest distance d3 is in a range of 16.0 μm to 18.0 μm, e.g., 16.0 μm to 16.5 μm, 16.5 μm to 17.0 μm, 17.0 μm to 17.5 μm, or 17.5 μm to 18.0 μm. Optionally, the first shortest distance d1 is 15.53 μm, the second shortest distance d2 is 13.65 μm, and the third shortest distance d3 is 16.87 μm.

Optionally, a ratio among the first shortest distance, the second shortest distance, and the third shortest distance is in a range of (14.5 to 16.5):(13.5 to 14.5):(16.0 to 18.0).

Figure 6A:
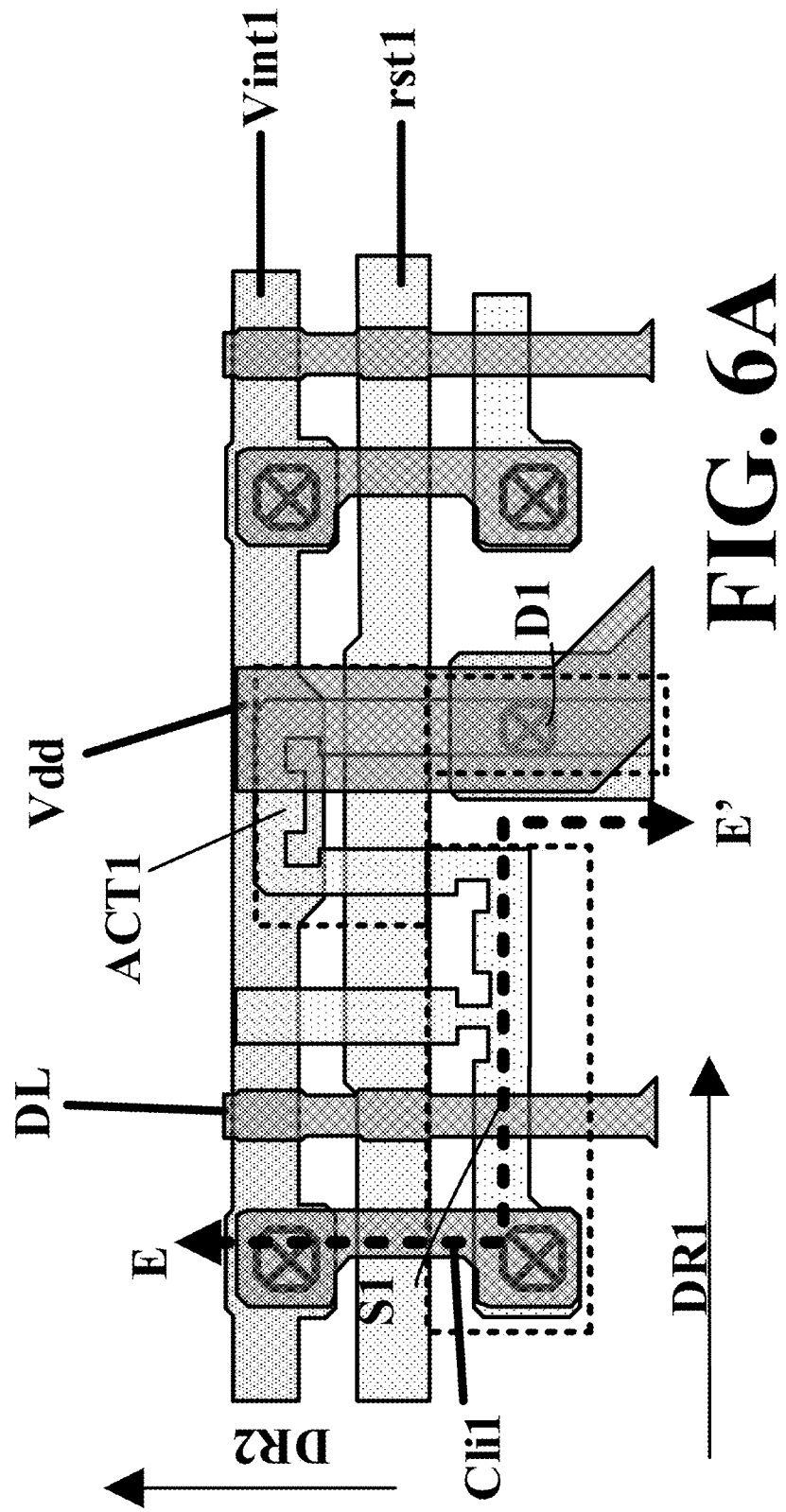
FIG. 6A is a partial view of a subpixel of an array substrate depicted in FIG. 3A.
Figure 6B:
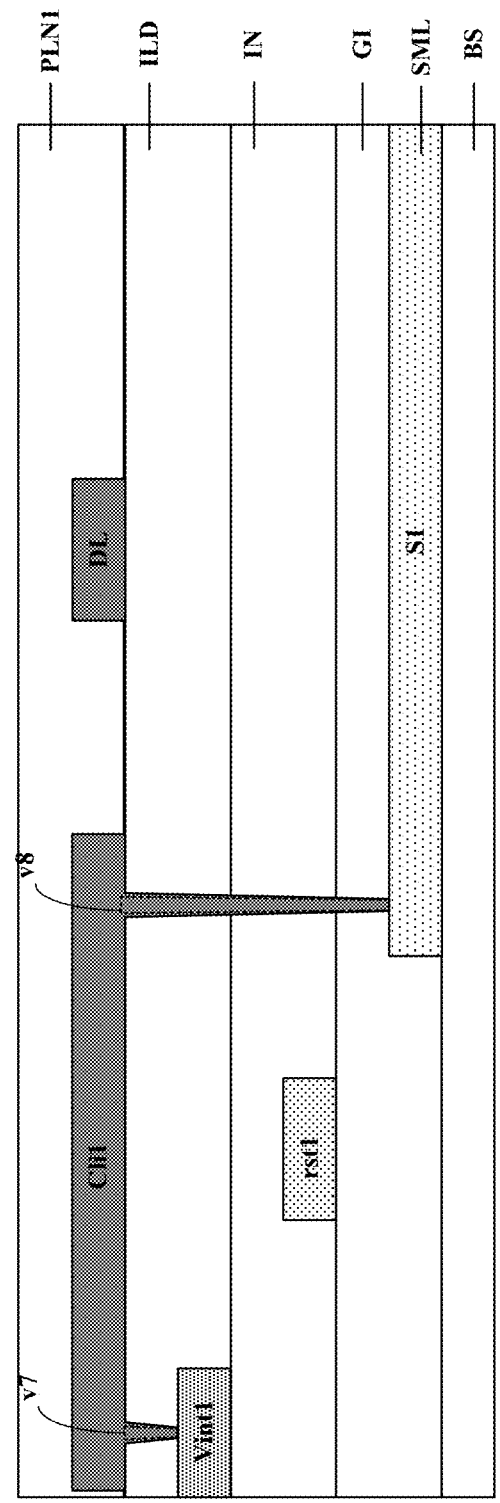
FIG. 6B is a cross-sectional view along an E-E' line in FIG. 6A.

The inventors in the present disclosure discover that, unexpectedly and surprisingly, the structure of various layers of the present array substrate results in a much enhance light transmittance. FIG. 6A is a partial view of a subpixel of an array substrate depicted in FIG. 3A. Referring to FIG. 6A, the first initialization connecting line Cli1 connects a respective one of the plurality of first reset signal lines Vint1 and the source electrode S1 of the first transistor T1 in a respective subpixel together. The respective one of the plurality of first reset signal lines Vint1 is configured to provide a reset signal to the source electrode S1 of the first transistor T1 in the respective subpixel, through the first initialization connecting line Cli1. FIG. 6B is a cross-sectional view along an E-E' line in FIG. 6A. Referring to FIG. 6A and FIG. 6B, the first initialization connecting line Cli1 is connected to the respective one of the plurality of first reset signal lines Vint1 through a seventh via v7 extending through the inter-layer dielectric layer ILD, and the first initialization connecting line Cli1 is connected to the source electrode S1 of the first transistor T1 in the respective subpixel through an eighth via v8 extending through the inter-layer dielectric layer ILD, the insulating layer IN, and the gate insulating layer GI. The first initialization connecting line Cli1 crosses over a respective one of the plurality of first reset control signal line rst1.

Referring to FIG. 3A, FIG. 3B, FIG. 6A, and FIG. 6B, in some embodiments, a source electrode S1, an active layer ACT1, and a drain electrode D1 of the first transistor T1 are parts of a unitary structure in a respective one of a plurality of subpixels. Referring to FIG. 6B, in some embodiments, the source electrode S1 of the first transistor T1 crosses over a respective one of the plurality of data lines DL. Optionally, the first initialization connecting line Cli1 is spaced apart from the active layer ACT1 and a drain electrode D1 of the first transistor T1 by the respective one of the plurality of data lines DL. Optionally, an orthographic projection of the first initialization connecting line Cli1 on a base substrate is spaced apart from orthographic projections of the active layer ACT1 and the drain electrode D1 of the first transistor T1 on the base substrate by an orthographic projection of the respective one of the plurality of data lines DL on the base substrate.

In some embodiments, the first initialization connecting line Cli1 extends along a direction substantially parallel to the second direction DR2. Optionally, the source electrode S1 of the first transistor T1 extends along a direction substantially parallel to the first direction DR1. Optionally, the source electrode S1 and the active layer ACT1 of the first transistor T1 are arranged along a direction substantially parallel to the first direction DR1.

Figure 7A:
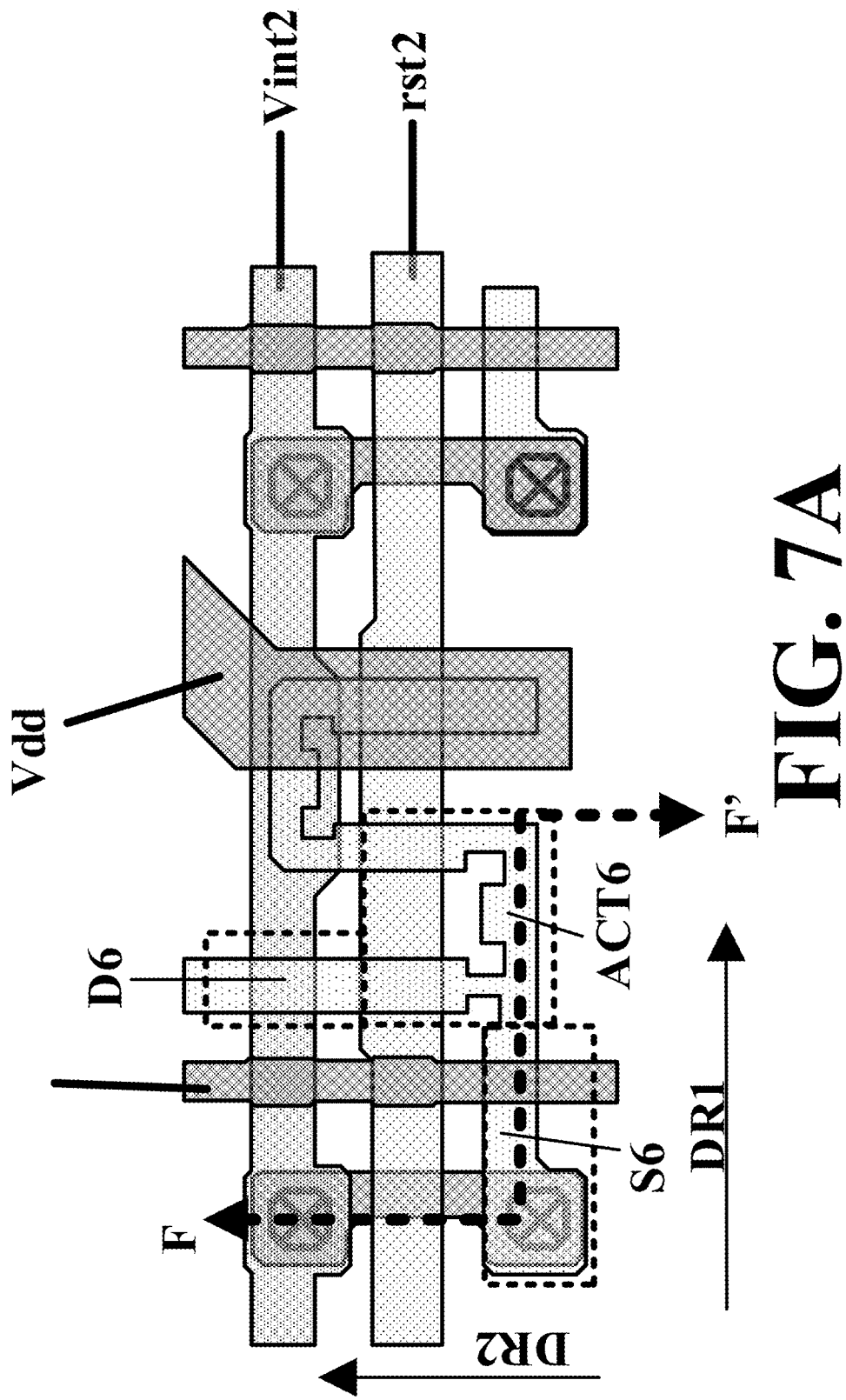
FIG. 7A is a partial view of a subpixel of an array substrate depicted in FIG. 3A.
Figure 7B:
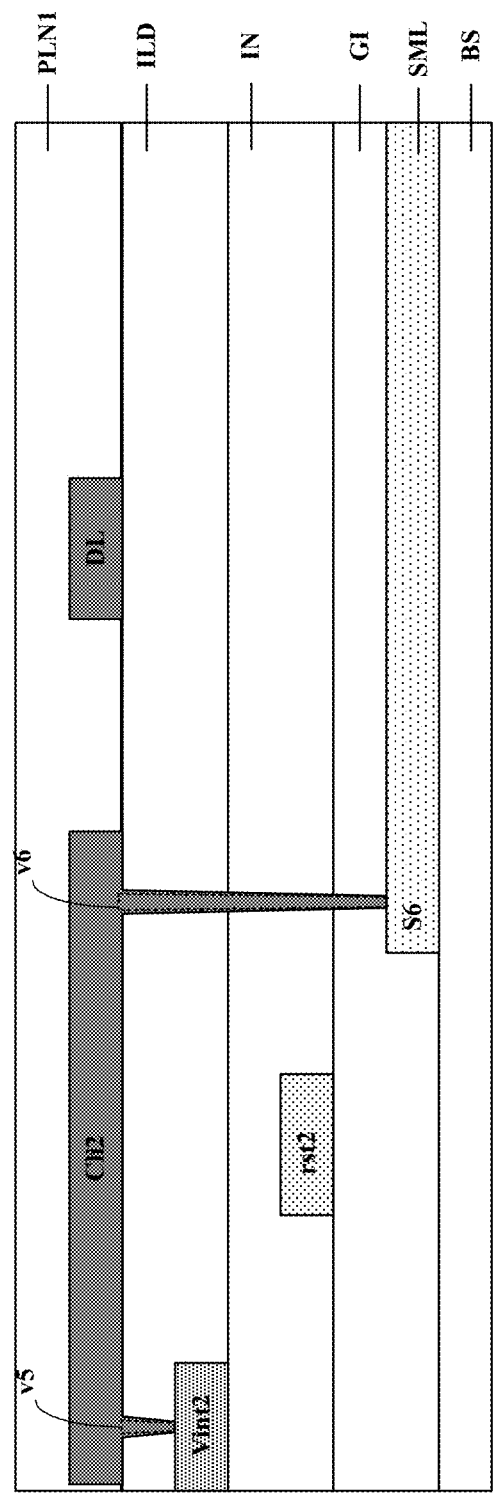
FIG. 7B is a cross-sectional view along an F-F' line in FIG. 7A.

FIG. 7A is a partial view of a subpixel of an array substrate depicted in FIG. 3A. Referring to FIG. 7A, the second initialization connecting line Cli2 connects a respective one of the plurality of second reset signal lines Vint2 and the source electrode of the sixth transistor T6 in a respective subpixel together. The respective one of the plurality of second reset signal lines Vint2 is configured to provide a reset signal to the source electrode S6 of the sixth transistor T6 in the respective subpixel, through the second initialization connecting line Cli2. FIG. 7B is a cross-sectional view along an F-F' line in FIG. 7A. Referring to FIG. 7A and FIG. 7B, the second initialization connecting line Cli2 is connected to the respective one of the plurality of second reset signal lines Vint2 through a fifth via v5 extending through the inter-layer dielectric layer ILD, and the second initialization connecting line Cli2 is connected to the source electrode S6 of the sixth transistor T6 in the respective subpixel through a sixth via v6 extending through the inter-layer dielectric layer ILD, the insulating layer IN, and the gate insulating layer GI. The second initialization connecting line Cli2 crosses over a respective one of the plurality of second reset control signal line rst2.

Referring to FIG. 3A, FIG. 3B, FIG. 7A, and FIG. 7B, in some embodiments, a source electrode S6, an active layer ACT6, and a drain electrode D6 of the sixth transistor T6 are parts of a unitary structure in a respective one of a plurality of subpixels. Referring to FIG. 7B, in some embodiments, the source electrode S6 of the sixth transistor T6 crosses over a respective one of the plurality of data lines DL. Optionally, the second initialization connecting line Cli2 is spaced apart from the active layer ACT6 and a drain electrode D6 of the sixth transistor T6 by the respective one of the plurality of data lines DL. Optionally, an orthographic projection of the second initialization connecting line Cli2 on a base substrate is spaced apart from orthographic projections of the active layer ACT6 and the drain electrode D6 of the sixth transistor T6 on the base substrate by an orthographic projection of the respective one of the plurality of data lines DL on the base substrate.

In some embodiments, the second initialization connecting line Cli2 extends along a direction substantially parallel to the second direction DR2. Optionally, the source electrode S6 of the sixth transistor T6 extends along a direction substantially parallel to the first direction DR1. Optionally, the source electrode S6 and the active layer ACT6 of the sixth transistor T6 are arranged along a direction substantially parallel to the first direction DR1.

The inventors in the present disclosure discover that, unexpectedly and surprisingly, by having the interference preventing block IPB, the storage capacitance Cst can be further increased. Referring to FIG. 5A again, in some embodiments, a drain electrode D1 of the first transistor T1 and a portion of the semiconductor material layer SML at a position connecting to the node connecting line Cln are arranged along a direction substantially parallel to the second direction DR2. Optionally, the portion of the semiconductor material layer SML at a position connecting to the node connecting line Cln is a source electrode S3 of the third transistor T3. Optionally, the source electrode S3 of the third transistor T3 and the drain electrode D1 of the first transistor T1 are parts of a unitary structure in a respective one of a plurality of subpixels. Optionally, the source electrode S3 of the third transistor T3 and the drain electrode D1 of the first transistor T1 are arranged along a direction substantially parallel to the second direction DR2.

Referring to FIG. 5A to FIG. 5F, in some embodiments, the drain electrode D1 of the first transistor T1 and the portion of the semiconductor material layer SML at a position connecting to the node connecting line Cln are arranged along a direction substantially parallel a direction along which the handle H and the base portion BP are arranged. Optionally, the source electrode S3 of the third transistor T3 and the drain electrode D1 of the first transistor T1 are arranged along a direction substantially parallel to the direction along which the handle H and the base portion BP are arranged.

Figure 8A:
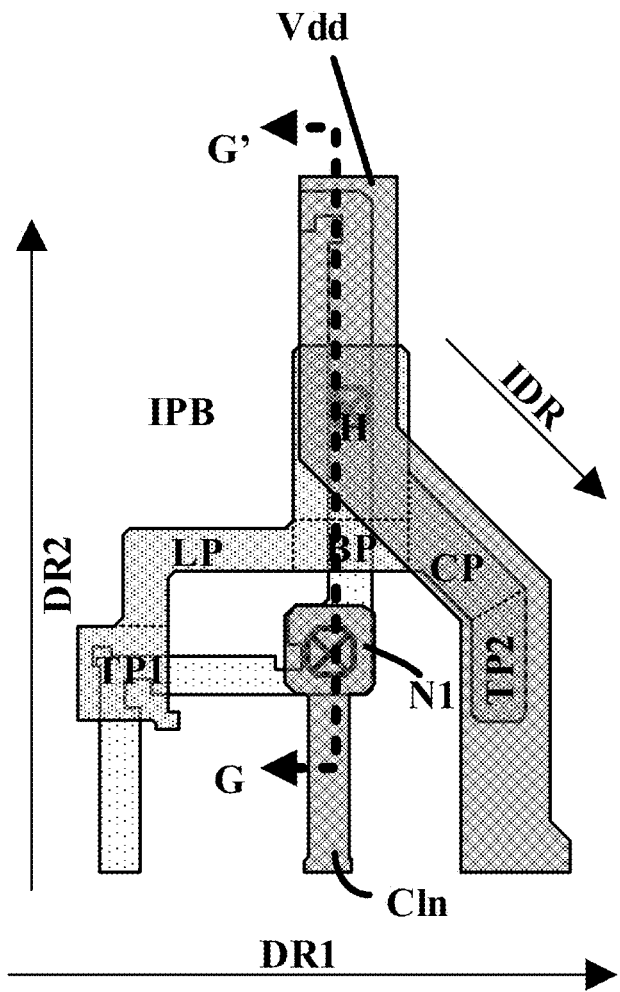
FIG. 8A is a partial view of an interference preventing block, a semiconductor material layer, and a respective one of the plurality of voltage supply line depicted in FIG. 5A.
Figure 8B:
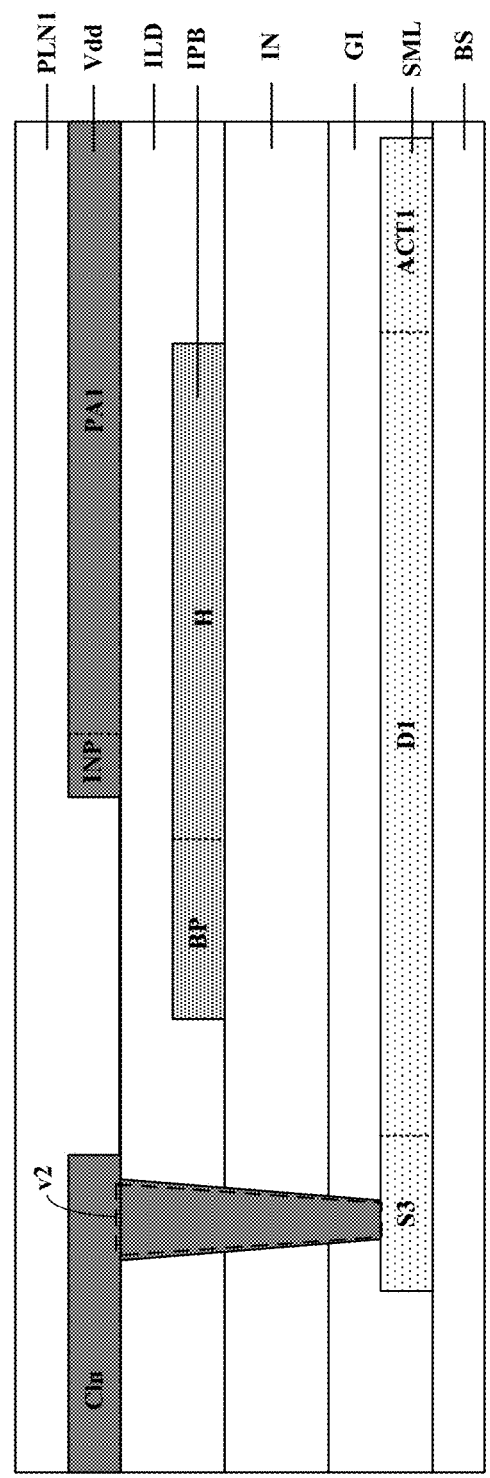
FIG. 8B is a cross-sectional view along a G-G' line in FIG. 8A.

FIG. 8A is a partial view of an interference preventing block, a semiconductor material layer, and a respective one of the plurality of voltage supply line depicted in FIG. 5A. FIG. 8B is a cross-sectional view along a G-G' line in FIG. 8A. Referring to FIG. 8A and FIG. 8B, in some embodiments, an orthographic projection of the interference preventing block IPB on the base substrate BS at least partially overlaps with (e.g., substantially covers) an orthographic projection of the drain electrode D1 of the first transistor T1 on the base substrate BS. Optionally, a combination of an orthographic projection of the base portion BP of the second arm AM2 on the base substrate BS and an orthographic projection of the handle H on the base substrate BS at least partially overlaps with (e.g., substantially covers) the orthographic projection of the drain electrode D1 of the first transistor T1 on the base substrate BS.

As used herein, the active layer refers to a component of the transistor comprising at least a portion of the semiconductor material layer whose orthographic projection on the base substrate overlaps with an orthographic projection of a gate electrode on the base substrate. As used herein, a source electrode refers to a component of the transistor connected to one side of the active layer, and a drain electrode refers to a component of the transistor connected to another side of the active layer. In the context of a double-gate type transistor (for example, the third transistor T3), the active layer refers to a component of the transistor comprising a first portion of the semiconductor material layer whose orthographic projection on the base substrate overlaps with an orthographic projection of a first gate on the base substrate, a second portion of the semiconductor material layer whose orthographic projection on the base substrate overlaps with an orthographic projection of a second gate on the base substrate, and a third portion between the first portion and the second portion. In the context of a double-gate type transistor, a source electrode refers to a component of the transistor connected to a side of the first portion distal to the third portion, and a drain electrode refers to a component of the transistor connected to a side of the second portion distal to the third portion.

Figure 9A:
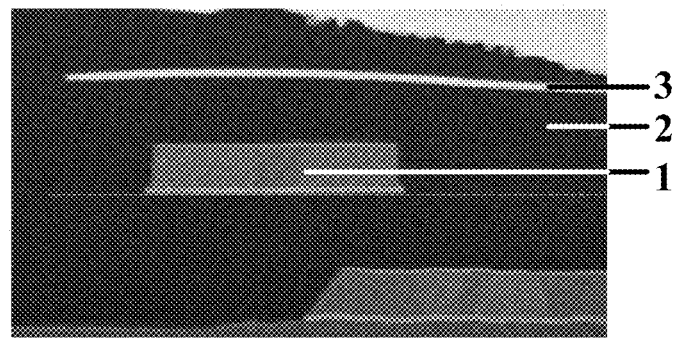
FIG. 9A is a cross-sectional image of an array substrate.

The inventors of the present disclosure discover that a degree of evenness of anodes in a display panel could adversely affect image display. For example, color shift may result from the anodes being tilted. It is discovered in the present disclosure that signal lines underneath the anodes could significantly affect the degree the anodes being titled. In one example, underneath an anode, at one side a signal line is disposed while the other side is absent of a signal line. This results in an uneven surface of a planarization layer on top of the signal line. The uneven surface of the planarization layer in turn results in the anode on top of the planarization layer being tilted. FIG. 9A is a cross-sectional image of an array substrate. As shown in FIG. 9A, the presence of a signal line 1 underneath a left side portion of the planarization layer 2 results in an uneven surface of the planarization, which in turn results in an anode 3 on top of the planarization layer 2 being titled toward the right side. The titled anode reflects more light toward the right side of the display panel. In the display panel, anodes associated with subpixels of different colors have different titled angles, thus light reflected by anodes in subpixels of different colors reflect light of different colors respectively at different angles. The accumulated effect of this issue lead to color shift at a large viewing angle.

Figure 9B:
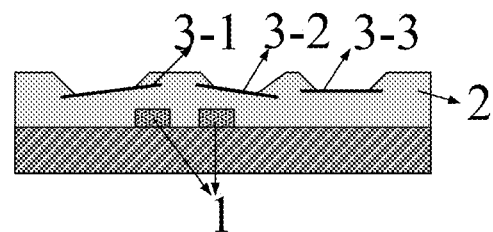
FIG. 9B is a schematic diagram illustrating a cross-sectional image of an array substrate.

FIG. 9B is a schematic diagram illustrating a cross-sectional image of an array substrate. As shown in FIG. 9B, signal lines 1 are absent underneath a third anode 3-3, which is not titled. The signal lines 1 are present underneath anodes 3-1 and 3-2. However, the signal line is only present underneath a right side portion of the anode 3-1, and only present underneath a left side portion of the anode 3-2, resulting in these two anodes being titled. Anodes 3-1, 3-2, and 3-3 are respectively anodes of a red subpixel, a green subpixel, and a blue subpixel. Because the titled angles of the anodes in three subpixels of different colors are different from each other, color shift at a large viewing angle occurs.

Figure 9C:
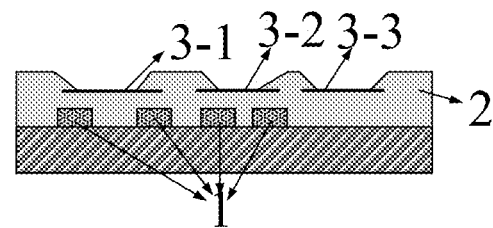
FIG. 9C is a schematic diagram illustrating a cross-sectional image of an array substrate.

FIG. 9C is a schematic diagram illustrating a cross-sectional image of an array substrate. As shown in FIG. 9C, signal lines are present underneath both the left side portion and the right side portion of the anode 3-1, and present underneath both the left side portion and the right side portion of the anode 3-2. All anodes are substantially not titled, alleviating the color shift issue.

Figure 10A:
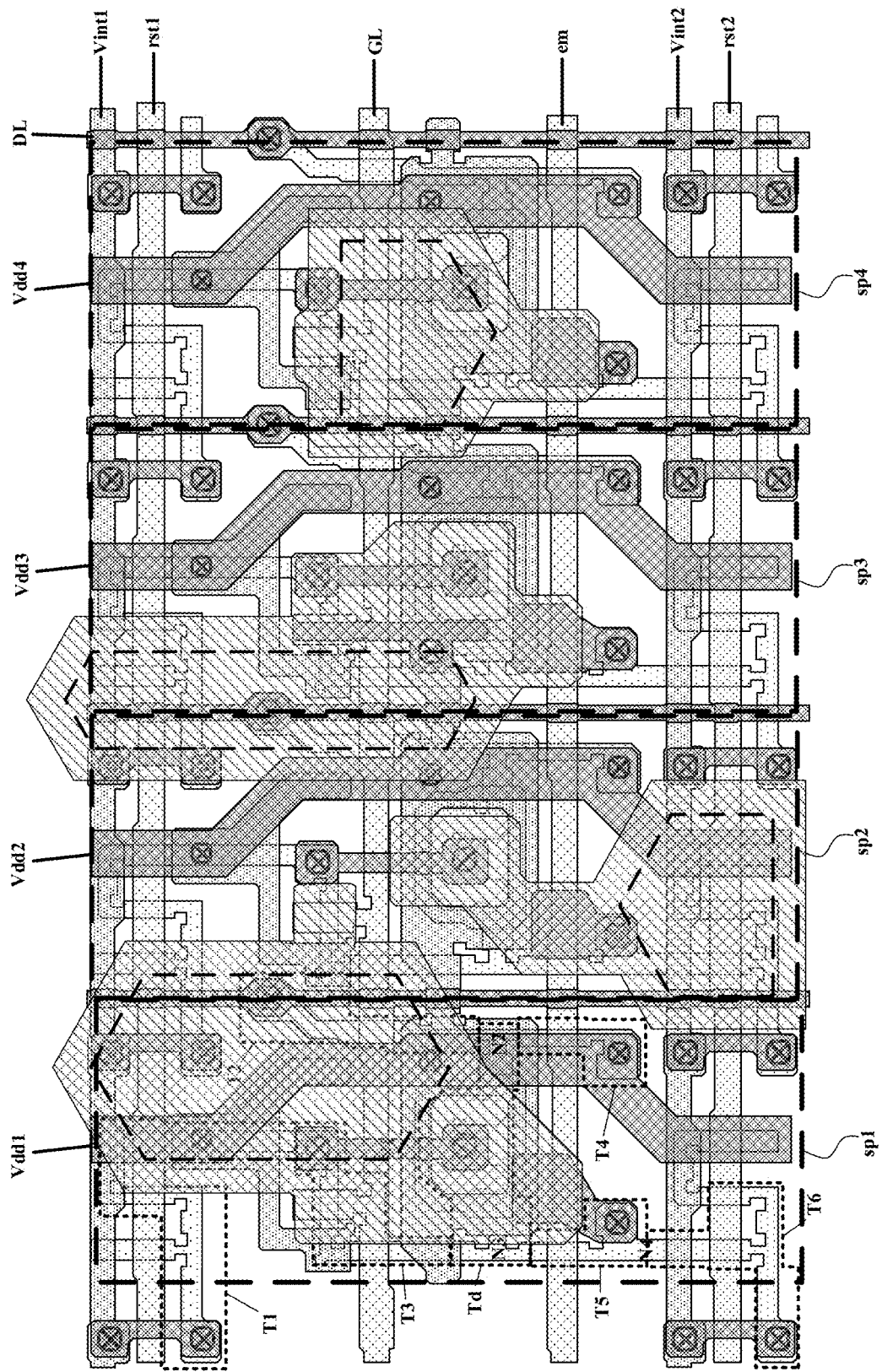
FIG. 10A is a diagram illustrating the structure of a plurality of subpixels of an array substrate in some embodiments according to the present disclosure.
Figure 10C:
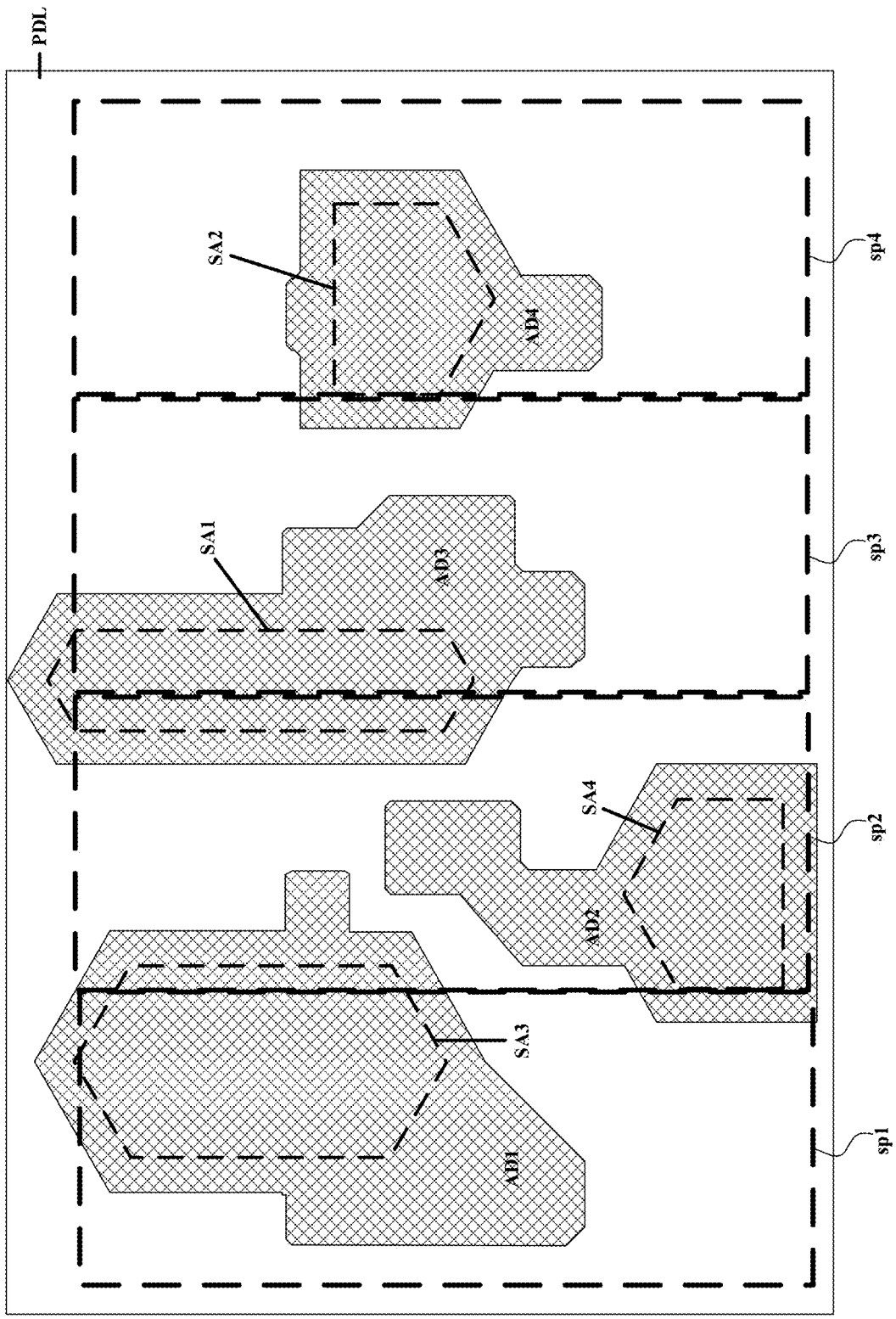
FIG. 10C is a diagram illustrating the structure of a pixel definition layer, and anodes of light emitting elements in a plurality of subpixels of an array substrate depicted in FIG. 10A.
Figure 10D:
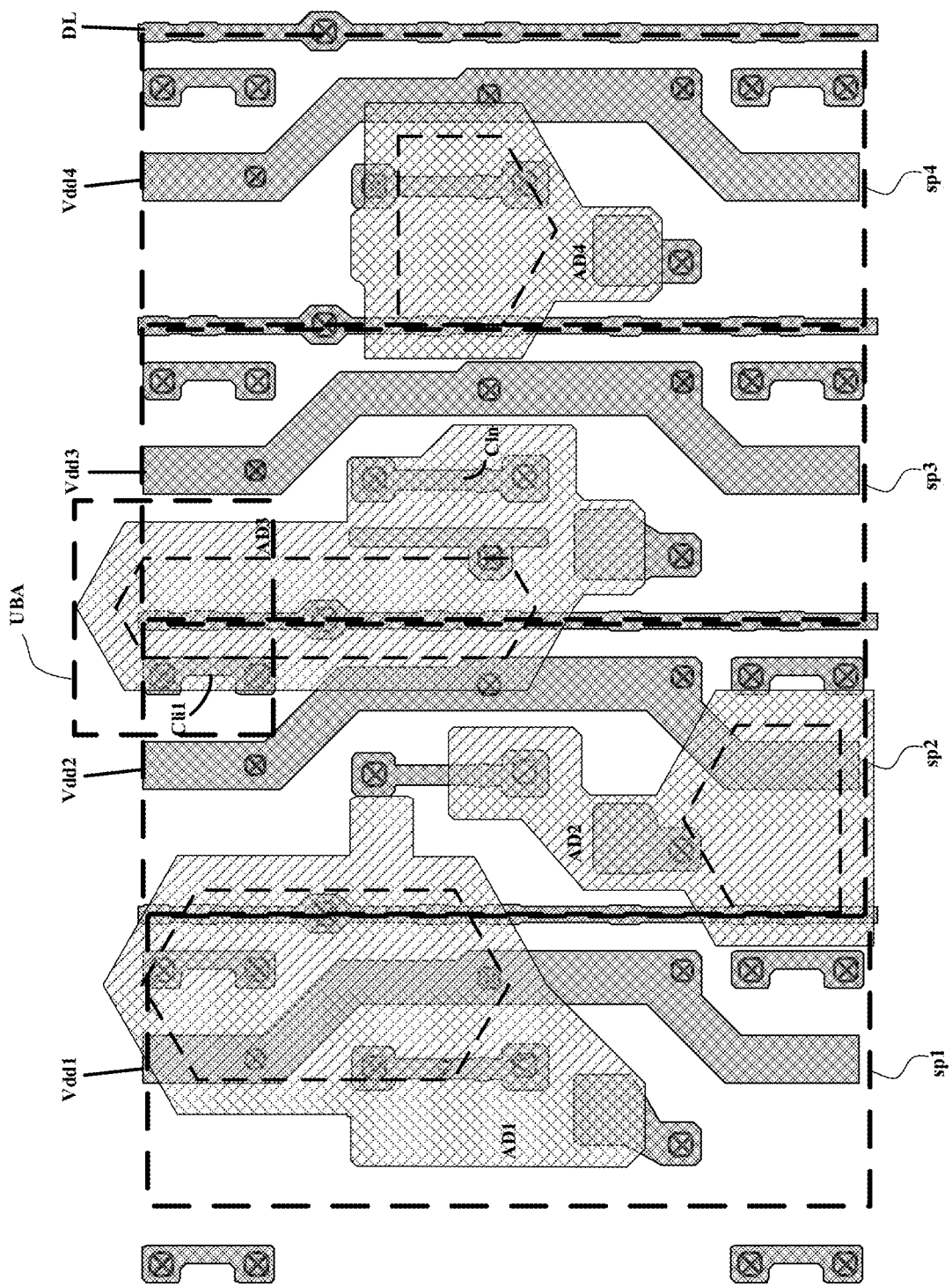
FIG. 10D is a diagram illustrating the structure of a signal line layer and anodes of light emitting elements in a plurality of subpixels of an array substrate depicted in FIG. 10A.

FIG. 10A is a diagram illustrating the structure of a plurality of subpixels of an array substrate in some embodiments according to the present disclosure. FIG. 10B is a diagram illustrating the structure of a signal line layer in a plurality of subpixels of an array substrate depicted in FIG. 10A. FIG. 10C is a diagram illustrating the structure of a pixel definition layer, and anodes of light emitting elements in a plurality of subpixels of an array substrate depicted in FIG. 10A. FIG. 10D is a diagram illustrating the structure of a signal line layer and anodes of light emitting elements in a plurality of subpixels of an array substrate depicted in FIG.

10A. Referring to FIG. 10A and FIG. 10B, a respective first subpixel sp1, a respective second subpixel sp2, a respective third subpixel sp3, and a respective fourth subpixel sp4 are depicted. The signal line layer in some embodiments includes a first anode contact pad ACP1 in the respective first subpixel sp1, a second anode contact pad ACP2 in the respective second subpixel sp2, a third anode contact pad ACP3 in the respective third subpixel sp3, and a fourth anode contact pad ACP4 in the respective fourth subpixel sp4. These anode contact pads respectively connects sources electrodes of fifth transistors respectively in the respective first subpixel sp1, the respective second subpixel sp2, the respective third subpixel sp3, and the respective fourth subpixel sp4, to anodes respectively in the respective first subpixel sp1, the respective second subpixel sp2, the respective third subpixel sp3, and the respective fourth subpixel sp4. Various appropriate conductive materials and various appropriate fabricating methods may be used to make the second signal line layer. For example, a conductive material may be deposited on the substrate by a plasma-enhanced chemical vapor deposition (PECVD) process and patterned. Examples of appropriate conductive materials for making the second signal line layer include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the first anode contact pad ACP1, the second anode contact pad ACP2, the third anode contact pad ACP3, and the fourth anode contact pad ACP4 are in a same layer.

Referring to FIG. 10A to FIG. 10C, the array substrate in some embodiments includes a respective first anode AD1 in the respective first subpixel sp1, a respective second anode AD2 in the respective second subpixel sp2, a respective third anode AD3 in the respective third subpixel sp3, and a respective fourth anode AD4 in the respective fourth subpixel sp4. The respective first anode AD1, the respective second anode AD2, the respective third anode AD3, and the respective fourth anode AD4, are respectively anodes of a first light emitting element, a second light emitting element, a third light emitting element, and a fourth light emitting element, respectively in the respective first subpixel sp1, the respective second subpixel sp2, the respective third subpixel sp3, and the respective fourth subpixel sp4. The array substrate in some embodiments further includes a pixel definition layer PDL on a side of the respective first anode AD1, the respective second anode AD2, the respective third anode AD3, and the respective fourth anode AD4 away from the first planarization layer PLN1. The array substrate further includes a first subpixel aperture SA1, a second subpixel aperture SA2, a third subpixel aperture SA3, a fourth subpixel aperture SA4 respectively extending through the pixel definition layer PDL, respectively exposing portions of the respective first anode AD1, the respective second anode AD2, the respective third anode AD3, and the respective fourth anode AD4.

Referring to FIG. 10B and FIG. 10D, the plurality of voltage supply lines Vdd in some embodiments includes a respective first voltage supply line Vdd1 in the respective first subpixel sp1, a respective second voltage supply line Vdd2 in the respective second subpixel sp2, a respective third voltage supply line Vdd3 in the respective third subpixel sp3, and a respective fourth voltage supply line Vdd4 in the respective fourth subpixel sp4. In some embodiments, as shown in FIG. 10B, the respective first voltage supply line Vdd1, the respective second voltage supply line Vdd2, the respective third voltage supply line Vdd3, and the respective fourth voltage supply line Vdd4 have a substantially same structure, for example, respective portions of the respective first voltage supply line Vdd1, the respective second voltage supply line Vdd2, the respective third voltage supply line Vdd3, and the respective fourth voltage supply line Vdd4, respectively in the respective first subpixel sp1, the respective second subpixel sp2, the respective third subpixel sp3, and the respective fourth subpixel sp4, have a same shape and dimension.

Referring to FIG. 10D, signal lines underneath the respective first anode AD1 are distributed in a relatively even and balanced fashion with respect to the respective first anode AD1. Similarly, signal lines underneath the respective second anode AD2 are distributed in a relatively even and balanced fashion with respect to the respective second anode AD2. Signal lines underneath the respective fourth anode AD4 are distributed in a relatively even and balanced fashion with respect to the respective fourth anode AD4. As discussed in connection with FIG. 9A to FIG. 9C, when the signal lines are distributed evenly underneath the anode, the anode is less likely to be titled. However, signal lines underneath the respective third anode AD3 are not distributed in an even and balanced fashion. For example, in a region UBA as shown in FIG. 10D, the first initialization connecting line Cli1 is disposed underneath the left-side portion of the respective third anode AD3. Underneath the right-side portion of the respective third anode AD3, however, there is no signal line. If not compensated, the unbalanced distribution of signal lines underneath the respective third anode AD3 would result in a titled anode and color shift in the display panel, resulting in color shift, particularly at a large viewing angle.

Figure 11A:
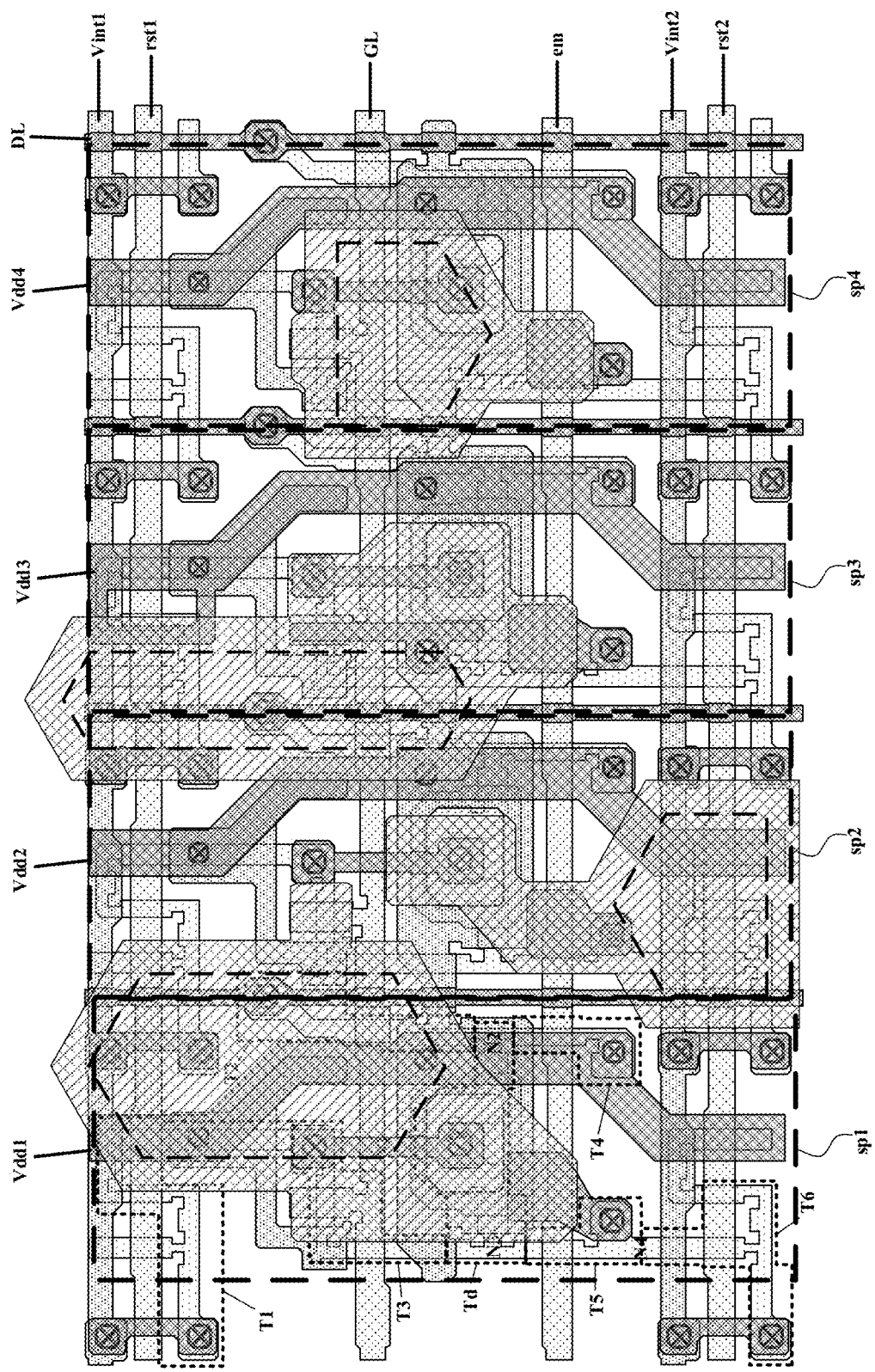
FIG. 11A is a diagram illustrating the structure of a plurality of subpixels of an array substrate in some embodiments according to the present disclosure.
Figure 11B:
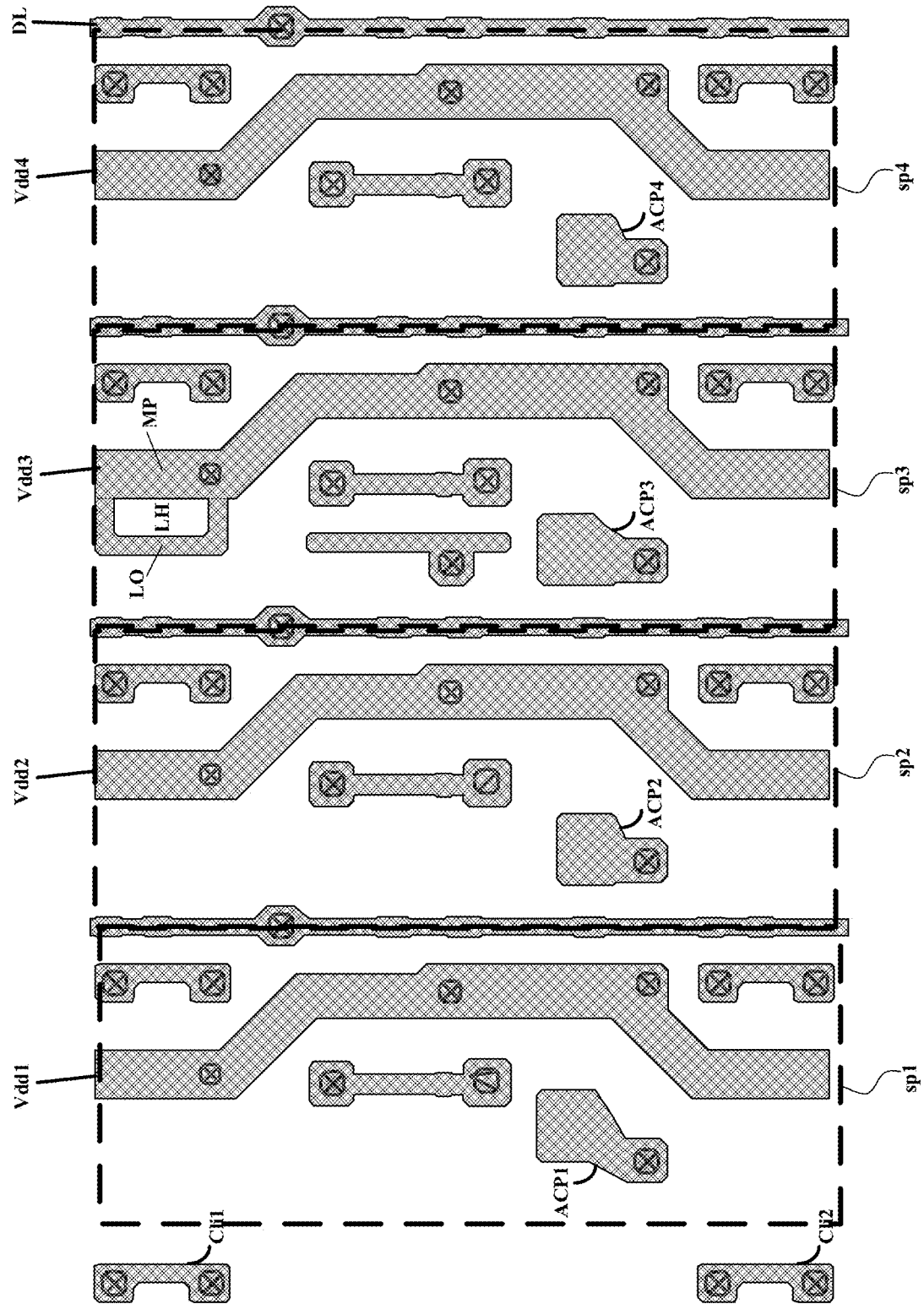
FIG. 11B is a diagram illustrating the structure of a signal line layer in a plurality of subpixels of an array substrate depicted in FIG. 11A.
Figure 11C:
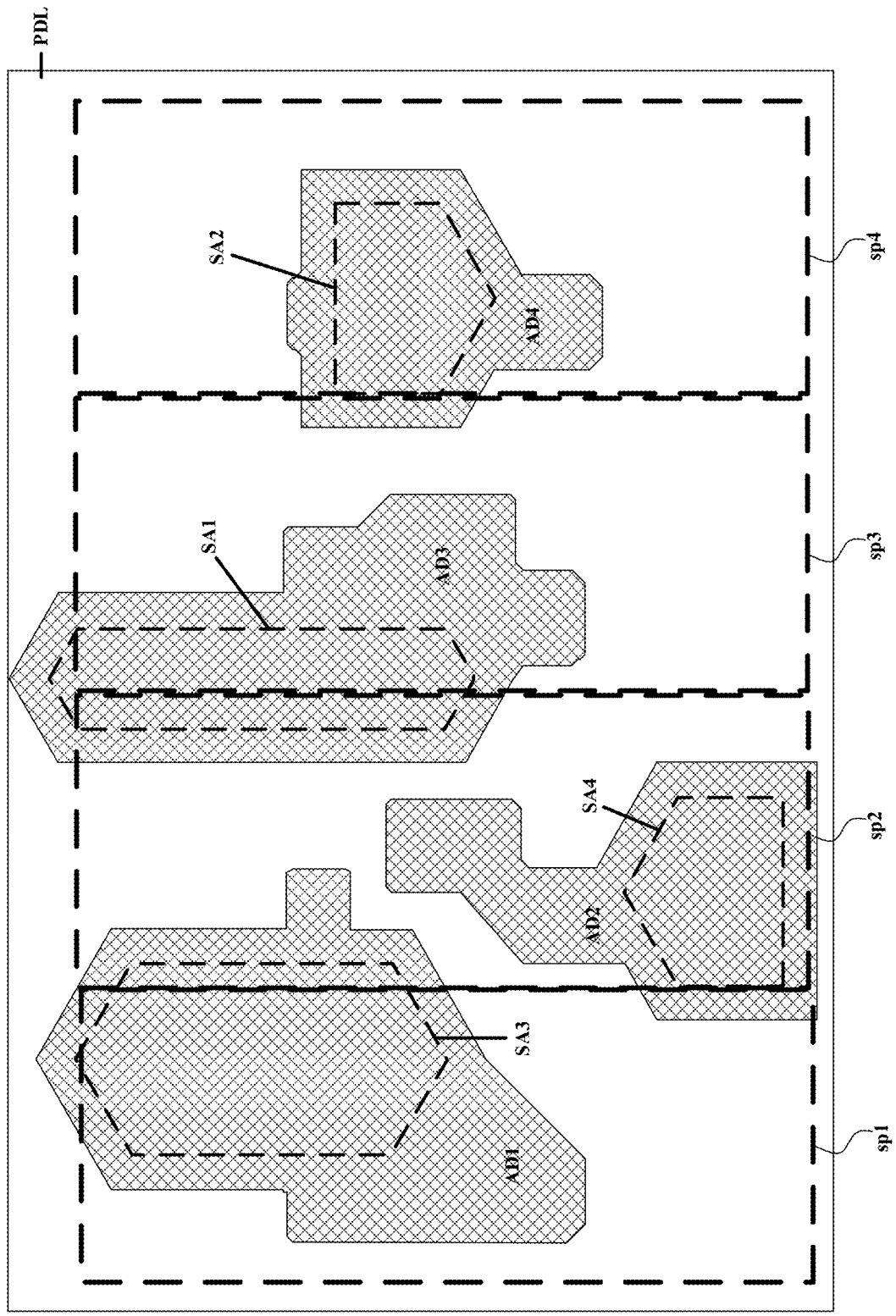
FIG. 11C is a diagram illustrating the structure of a pixel definition layer, and anodes of light emitting elements in a plurality of subpixels of an array substrate depicted in FIG. 11A.
Figure 11D:
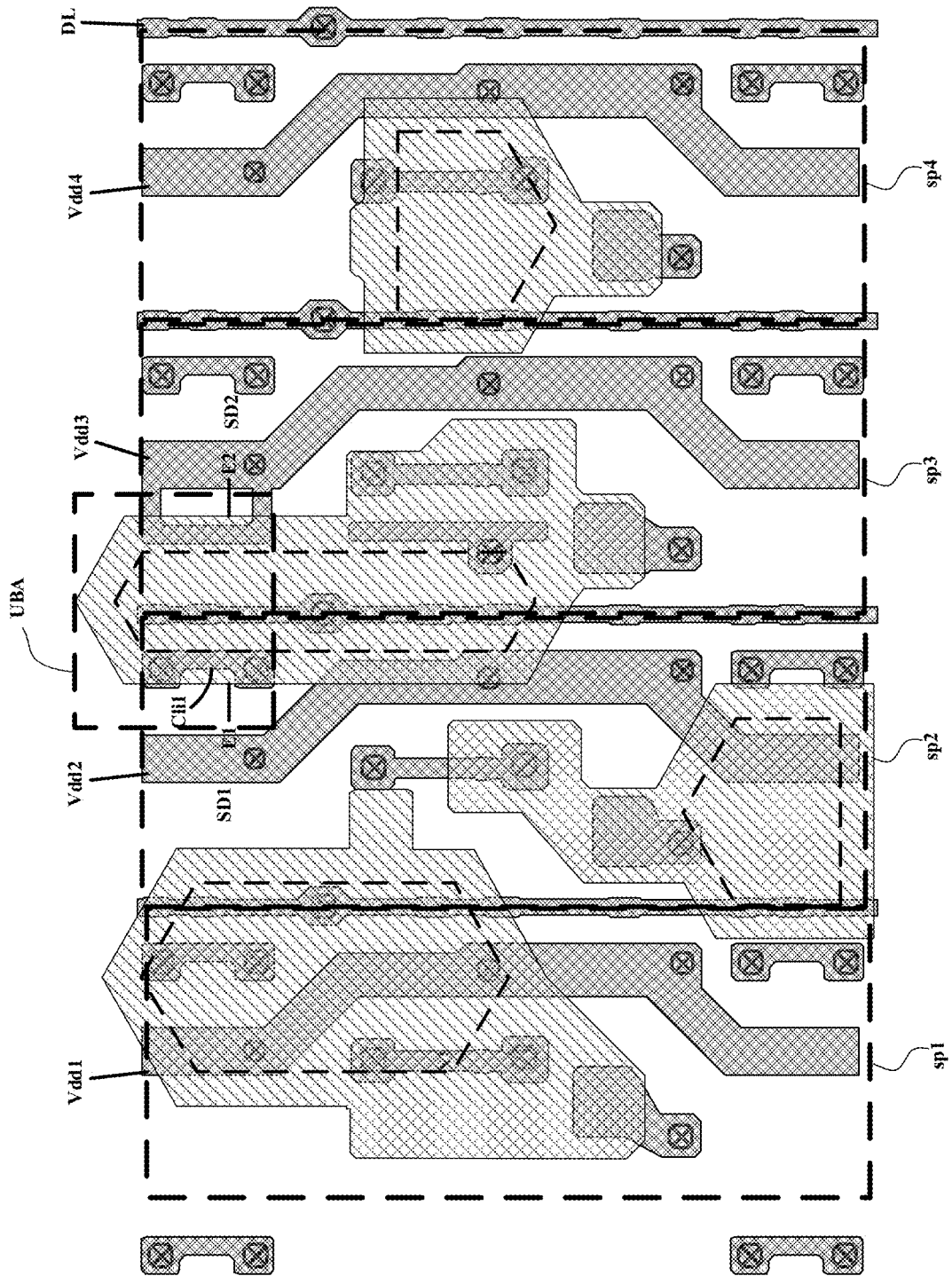
FIG. 11D is a diagram illustrating the structure of a signal line layer and anodes of light emitting elements in a plurality of subpixels of an array substrate depicted in FIG. 11A.

FIG. 11A is a diagram illustrating the structure of a plurality of subpixels of an array substrate in some embodiments according to the present disclosure. FIG. 11B is a diagram illustrating the structure of a signal line layer in a plurality of subpixels of an array substrate depicted in FIG. 11A. FIG. 11C is a diagram illustrating the structure of a pixel definition layer, and anodes of light emitting elements in a plurality of subpixels of an array substrate depicted in FIG. 11A. FIG. 11D is a diagram illustrating the structure of a signal line layer and anodes of light emitting elements in a plurality of subpixels of an array substrate depicted in FIG. 11A. Referring to FIG. 11A to FIG. 11D, the plurality of voltage supply lines Vdd in some embodiments includes a respective first voltage supply line Vdd1 in the respective first subpixel sp1, a respective second voltage supply line Vdd2 in the respective second subpixel sp2, a respective third voltage supply line Vdd3 in the respective third subpixel sp3, and a respective fourth voltage supply line Vdd4 in the respective fourth subpixel sp4. In some embodiments, as shown in FIG. 11B, the respective first voltage supply line Vdd1, the respective second voltage supply line Vdd2, and the respective fourth voltage supply line Vdd4 have a substantially same structure, for example, respective portions of the respective first voltage supply line Vdd1, the respective second voltage supply line Vdd2, and the respective fourth voltage supply line Vdd4, respectively in the respective first subpixel sp1, the respective second subpixel sp2, and the respective fourth subpixel sp4, have a same shape and dimension.

The inventors of the present disclosure discover that, unexpectedly and surprisingly, the color shift issue in connection with the third anode AD can be significantly reduced or eliminated by having a respective third voltage supply line Vdd3 of a different shape from that of the respective first voltage supply line Vdd1, the respective second voltage supply line Vdd2, and the respective fourth voltage supply line Vdd4. Referring to FIG. 11B, in some embodiments, as compared to the respective first voltage supply line Vdd1, the respective second voltage supply line Vdd2, and the respective fourth voltage supply line Vdd4, the respective third voltage supply line Vdd3 includes a main portion MP and a loop portion LO connected to the main portion MP. Referring to FIG. 11B and FIG. 11D, in the region UBA as shown in FIG. 11D, the first initialization connecting line Cli1 is disposed underneath the left-side portion of the respective third anode AD3; and the loop portion LO is disposed underneath the right-side portion of the respective third anode AD3. By having the loop portion LO underneath the right-side portion of the respective third anode AD3, the signal lines (the first initialization connecting line Cli1 and the loop portion LO) are more evenly distributed underneath the respective third anode AD3, preventing the respective third anode AD3 being titled. As a result, color shift issue can be alleviated.

As shown in FIG. 11D, an orthographic projection of the respective third anode AD3 on the base substrate at least partially overlaps with (e.g., substantially covers) an orthographic projection of the first initialization connecting line Cli1 on the base substrate, and at least partially overlaps with (e.g., substantially covers) an orthographic projection of the loop portion LO on the base substrate. Moreover, an orthographic projection of the respective one of the plurality of data lines DL on the respective third anode AD3 is between an orthographic projection of the first initialization connecting line Cli1 on the respective third anode AD3 and an orthographic projection of the loop portion LO on the respective third anode AD3, achieving a balanced distribution of signal lines underneath the respective third anode AD3.

Figure 12:
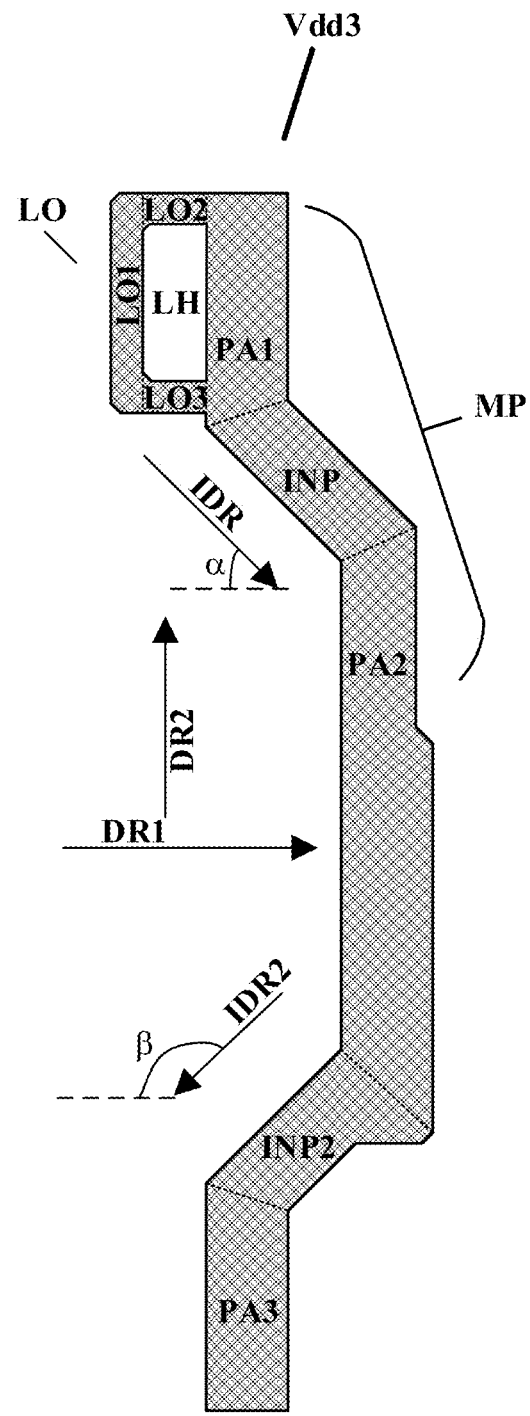
FIG. 12 is a diagram illustrating the structure of a third voltage supply line in some embodiments according to the present disclosure.

FIG. 12 is a diagram illustrating the structure of a third voltage supply line in some embodiments according to the present disclosure. Referring to FIG. 12, the loop portion PO in some embodiments includes a first loop sub-portion LO1 along a direction substantially parallel to the second direction DR2, a second loop sub-portion LO2 substantially parallel to the first direction DR1, and a third loop sub-portion LO3 substantially parallel to the first direction DR1. The second loop sub-portion LO2 and the third loop sub-portion LO3 respectively connect the first loop sub-portion LO1 to the main portion of the respective third voltage supply line Vdd3. The array substrate further includes a loop hole LH extending through the respective third voltage supply line Vdd3. A perimeter of the loop hole LH is surrounded by a combination of the first loop sub-portion LO1, the second loop sub-portion LO2, the third loop sub-portion LO3, and the main portion MP.

As shown in FIG. 11D and FIG. 12, in some embodiments, an orthographic projection of the respective third anode AD3 on the base substrate at least partially overlaps with (e.g., substantially covers) an orthographic projection of the first initialization connecting line Cli1 on the base substrate, and at least partially overlaps with (e.g., substantially covers) an orthographic projection of the first loop sub-portion LO1 on the base substrate. Moreover, an orthographic projection of the respective one of the plurality of data lines DL on the respective third anode AD3 is between an orthographic projection of the first initialization connecting line Cli1 on the respective third anode AD3 and an orthographic projection of the first loop sub-portion LO1 on the respective third anode AD3, achieving a balanced distribution of signal lines underneath the respective third anode AD3.

Referring to FIG. 5G and FIG. 12, as discussed above, the respective third voltage supply line Vdd3 in some embodiments includes a first parallel portion PA1, a second parallel portion PA2, and a first inclined portion INP connecting the first parallel portion PA1 and the second parallel portion PA2 along an inclined direction IDR. The first parallel portion PA1 and the second parallel portion PA2 respectively extend along a direction substantially parallel to the second direction DR2. The first inclined portion INP extends along an inclined angle α with respect to the first direction DR1. The connecting portion INP extends along a direction substantially parallel to the inclined direction IDR. In some embodiments, the second loop sub-portion LO2 and the third loop sub-portion LO3 respectively connect the first loop sub-portion LO1 to the first parallel portion PA1 of the main portion MP. A perimeter of the loop hole LH is surrounded by a combination of the first loop sub-portion LO1, the second loop sub-portion LO2, the third loop sub-portion LO3, and the first parallel portion PAL Optionally, the respective third voltage supply line Vdd3 further includes a second inclined portion INP2 connected to the second parallel portion PA2, and a third parallel portion PA3 connected to the second inclined portion INP2. The third parallel portion PA3 extends along a direction substantially parallel to the second direction DR2. The second inclined portion INP2 extends along a second inclined angle β with respect to the first direction DR1. The inclined angle α and the second inclined angle β are supplementary to each other. An orthographic projection of the second inclined portion INP2 on the base substrate BS is non-overlapping with an orthographic projection of the connecting portion CP on the base substrate BS.

Referring to FIG. 11C, FIG. 11D, FIG. 12, signal lines are distributed underneath the respective third anode AD3 by having the first initialization connecting line Cli1 underneath the respective third anode AD3 on a first side SD1 along a first edge E1 of the respective third anode AD3 and the loop portion LP underneath the respective third anode AD3 on a second side SD2 along a second edge E2 of the respective third anode AD3. Optionally, the first edge E1 and the second edge E2 are substantially parallel to each other. Optionally, the first side SD1 and the second side SD2 are opposite to each other.

In another aspect, the present disclosure provides a display panel including the array substrate described herein or fabricated by a method described herein, and a counter substrate facing the array substrate. Optionally, the display panel is an organic light emitting diode display panel. Optionally, the display panel is micro light emitting diode display panel.

In another aspect, the present invention provides a display apparatus, including the array substrate described herein or fabricated by a method described herein, and one or more integrated circuits connected to the array substrate.

In another aspect, the present invention provides a method of fabricating an array substrate. In some embodiments, the method includes forming a plurality of gate lines, a plurality of first reset control signal lines, a plurality of first reset signal lines, respectively extending along a first direction; forming a plurality of data lines respectively extending along a second direction; and forming a pixel driving circuit. Optionally, forming the pixel driving circuit includes forming a driving transistor; forming a first transistor, and forming a storage capacitor. Optionally, forming the first transistor includes forming a gate electrode connected to a respective one of the plurality of first reset control signal lines, forming a source electrode connected to a respective one of the plurality of first reset signal lines, and forming a drain electrode connected to a gate electrode of the driving transistor and a first capacitor electrode of the storage capacitor. Optionally, forming the array substrate includes forming a first initialization connecting line connecting the respective one of the plurality of first reset signal lines and a source electrode of the first transistor in a respective one of a plurality of subpixels, the respective one of the plurality of first reset signal lines configured to provide a reset signal to the source electrode of the first transistor, through the first initialization connecting line. Optionally, the first initialization connecting line is formed in a same layer as the plurality of data lines. Optionally, the method further includes forming a via extending through an inter-layer dielectric layer; the first initialization connecting line is formed to be connected to the respective one of the plurality of first reset signal lines through a via extending through an inter-layer dielectric layer. Optionally, the method further includes forming a via extending through the inter-layer dielectric layer, an insulating layer, and a gate insulating layer; the first initialization connecting line is formed to be connected to the source electrode of the first transistor through a via extending through the inter-layer dielectric layer, an insulating layer, and a gate insulating layer. Optionally, the first initialization connecting line is formed to cross over a respective one of the plurality of first reset control signal line.

In some embodiments, an active layer and the drain electrode of the first transistor are formed as parts of a unitary structure in the respective one of the plurality of subpixels. Optionally, at least a portion of the source electrode of the first transistor is formed to cross over a respective one of the plurality of data lines. Optionally, an orthographic projection of the first initialization connecting line on a base substrate is spaced apart from orthographic projections of at least a portion of the active layer and at least a portion of the drain electrode of the first transistor on the base substrate by an orthographic projection of the respective one of the plurality of data lines on the base substrate.

In some embodiments, the method further comprises forming a plurality of second reset control signal lines and forming a plurality of second reset signal lines, respectively extending along the first direction. Optionally, forming the pixel driving circuit further includes forming a second transistor; forming a third transistor, forming a fourth transistor, forming a fifth transistor, and forming a sixth transistor. Optionally, forming the sixth transistor includes forming a gate electrode connected to a respective one of the plurality of second reset control signal lines, forming a source electrode connected to a respective one of the plurality of second reset signal lines, and forming a drain electrode connected to a drain electrode of the fifth transistor and an anode of a light emitting element. Optionally, forming the array substrate includes forming a second initialization connecting line connecting the respective one of the plurality of second reset signal lines and the source electrode of the sixth transistor in the respective one of the plurality of subpixels, the respective one of the plurality of second reset signal lines is configured to provide a reset signal to the source electrode of the sixth transistor through the second initialization connecting line. Optionally, the method further includes forming a via extending through the inter-layer dielectric layer; the second initialization connecting line is connected to the respective one of the plurality of second reset signal lines through the via extending through the inter-layer dielectric layer. Optionally, the method further includes forming a via extending through the inter-layer dielectric layer, the insulating layer, and the gate insulating layer; the second initialization connecting line is connected to the source electrode of the sixth transistor through the via extending through the inter-layer dielectric layer, the insulating layer, and the gate insulating layer. Optionally, the second initialization connecting line is formed to cross over a respective one of the plurality of second reset control signal line.

In some embodiments, an active layer and the drain electrode of the sixth transistor are formed as parts of a unitary structure in the respective one of a plurality of subpixels. Optionally, the source electrode of the sixth transistor is formed to cross over the respective one of the plurality of data lines. Optionally, an orthographic projection of the second initialization connecting line on the base substrate is spaced apart from orthographic projections of the active layer and the drain electrode of the sixth transistor on the base substrate by an orthographic projection of the respective one of the plurality of data lines on the base substrate.

In some embodiments, the method further comprises forming a plurality of voltage supply lines respectively extending along the second direction. Optionally, forming the storage capacitor includes forming the first capacitor electrode, forming a second capacitor electrode electrically connected to a respective one of the plurality of voltage supply lines, and forming the insulating layer between the first capacitor electrode and the second capacitor electrode. Optionally, forming the array substrate includes forming a semiconductor material layer on a base substrate; forming a node connecting line in a same layer as the respective one of the plurality of voltage supply lines, connected to the first capacitor electrode through a first via, and connected to the semiconductor material layer through a second via; and forming an interference preventing block in a same layer as the second capacitor electrode, the respective one of the plurality of voltage supply lines connected to the interference preventing block through a third via.

In some embodiments, forming the array substrate includes forming a semiconductor material layer on a base substrate. Optionally, at least a portion of the drain electrode of the first transistor and a portion of the semiconductor material layer at a position connecting to the node connecting line are arranged along a direction substantially parallel to the second direction.

In some embodiments, forming the pixel driving circuit further comprises a second transistor and a third transistor. Optionally, forming the second transistor includes forming a gate electrode connected to a respective one of the plurality of gate lines, forming a source electrode connected to a respective one of the plurality of data lines, and forming a drain electrode connected to a source electrode of the driving transistor. Optionally, forming the third transistor includes forming a gate electrode connected to the respective one of the plurality of gate lines, forming a source electrode connected to the first capacitor electrode and a gate electrode of the driving transistor, and forming a drain electrode connected to a drain electrode of the driving transistor. Optionally, the portion of the semiconductor material layer at a position connecting to the node connecting line includes at least a portion of the source electrode of the third transistor. Optionally, the source electrode of the third transistor and the drain electrode of the first transistor are formed as parts of a unitary structure in a respective one of a plurality of subpixels. Optionally, at least a portion of the source electrode of the third transistor and at least a portion of the drain electrode of the first transistor are arranged along a direction substantially parallel to the second direction.

In some embodiments, an orthographic projection of the interference preventing block on the base substrate at least partially overlaps with (e.g., substantially covers) an orthographic projection of the drain electrode of the first transistor on the base substrate.

In some embodiments, forming the interference preventing block includes forming a handle, forming a first arm and forming a second arm. Optionally, the respective one of the plurality of voltage supply lines is formed to be connected to the handle through the third via. Optionally, forming the first arm includes forming a L-shaped portion and forming a first tip portion. Optionally, forming the second arm includes forming a base portion, forming a second tip portion, and forming a connecting portion connecting the base portion and the second tip portion. Optionally, the base portion is formed to connect the L-shaped portion and the handle. Optionally, along the first direction, a portion of the node connecting line at a position connecting to the semiconductor material layer through the second via is spaced apart from a first adjacent data line by the first arm, and is spaced apart from a second adjacent data line by the second arm.

In some embodiments, a combination of an orthographic projection of the base portion of the second arm on the base substrate and an orthographic projection of the handle on the base substrate at least partially overlaps with (e.g., substantially covers) the orthographic projection of the drain electrode of the first transistor on the base substrate.

As used herein, the active layer refers to a component of the transistor comprising at least a portion of the semiconductor material layer whose orthographic projection on the base substrate overlaps with an orthographic projection of a gate electrode on the base substrate. As used herein, a source electrode refers to a component of the transistor connected to one side of the active layer, and a drain electrode refers to a component of the transistor connected to another side of the active layer. In the context of a double-gate type transistor (for example, the third transistor T3), the active layer refers to a component of the transistor comprising a first portion of the semiconductor material layer whose orthographic projection on the base substrate overlaps with an orthographic projection of a first gate on the base substrate, a second portion of the semiconductor material layer whose orthographic projection on the base substrate overlaps with an orthographic projection of a second gate on the base substrate, and a third portion between the first portion and the second portion. In the context of a double-gate type transistor, a source electrode refers to a component of the transistor connected to a side of the first portion distal to the third portion, and a drain electrode refers to a component of the transistor connected to a side of the second portion distal to the third portion.

In some embodiments, forming the pixel driving circuit further includes forming a second transistor and a third transistor. Optionally, forming the second transistor includes forming a gate electrode connected to a respective one of the plurality of gate lines, forming a source electrode connected to a respective one of the plurality of data lines, and forming a drain electrode connected to a source electrode of the driving transistor. Optionally, forming the third transistor includes forming a gate electrode connected to the respective one of the plurality of gate lines, forming a source electrode connected to the first capacitor electrode and a gate electrode of the driving transistor, and forming a drain electrode connected to a drain electrode of the driving transistor. Optionally, at least a portion of the drain electrode of the first transistor and the portion of the semiconductor material layer at a position connecting to the node connecting line are arranged along a direction substantially parallel a direction along which the handle and the base portion are arranged. Optionally, at least a portion of the source electrode of the third transistor and at least a portion of the drain electrode of the first transistor are arranged along a direction substantially parallel to the direction along which the handle and the base portion are arranged.

In some embodiments, forming the plurality of subpixels includes forming a respective first subpixel, forming a respective second subpixel, forming a respective third subpixel, and forming a respective fourth subpixel. Optionally, forming the array substrate further includes forming a respective first voltage supply line in the respective first subpixel; forming a respective second voltage supply line in the respective second subpixel; forming a respective third voltage supply line in the respective third subpixel; forming a respective fourth voltage supply line in the respective fourth subpixel; forming a respective first anode electrically connected to a respective first light emitting element in the respective first subpixel; forming a respective second anode electrically connected to a respective second light emitting element in the respective second subpixel; forming a respective third anode electrically connected to a respective third light emitting element in the respective third subpixel; and forming a respective fourth anode electrically connected to a respective fourth light emitting element in the respective fourth subpixel. Optionally, forming the respective third voltage supply line includes forming a main portion and forming a loop portion connected to the main portion. Optionally, an orthographic projection of the respective third anode on a base substrate at least partially overlaps with (e.g., substantially covers) an orthographic projection of the first initialization connecting line on the base substrate, and at least partially overlaps with (e.g., substantially covers) an orthographic projection of the loop portion on the base substrate.

In some embodiments, an orthographic projection of a respective one of the plurality of data lines on the respective third anode is between an orthographic projection of the first initialization connecting line on the respective third anode and an orthographic projection of the loop portion on the respective third anode.

In some embodiments, the loop portion comprises a first loop sub-portion along a direction substantially parallel to the second direction, a second loop sub-portion substantially parallel to the first direction, and a third loop sub-portion substantially parallel to the first direction. Optionally, the second loop sub-portion and the third loop sub-portion respectively connect the first loop sub-portion to the main portion of the respective third voltage supply line. Optionally, forming the array substrate further includes forming a loop hole extending through the respective third voltage supply line. Optionally, a perimeter of the loop hole is surrounded by a combination of the first loop sub-portion, the second loop sub-portion, the third loop sub-portion, and the main portion.

In some embodiments, the orthographic projection of the respective third anode on a base substrate at least partially overlaps with (e.g., substantially covers) the orthographic projection of the first initialization connecting line on the base substrate, and at least partially overlaps with (e.g., substantially covers) an orthographic projection of the first loop sub-portion on the base substrate. Optionally, an orthographic projection of a respective one of the plurality of data lines on the respective third anode is between an orthographic projection of the first initialization connecting line on the respective third anode and an orthographic projection of the first loop sub-portion on the respective third anode.

In some embodiments, a source electrode and an active layer of the third transistor are formed as parts of a unitary structure in a respective one of a plurality of subpixels. Optionally, the node connecting line is formed to be connected to the source electrode of the third transistor through the second via. Optionally, an orthographic projection of the first arm on a base substrate at least partially overlaps with an orthographic projection of an active layer of third transistor on the base substrate. Optionally, an orthographic projection of a respective one of the plurality of voltage supply lines on the base substrate at least partially overlaps with (e.g., substantially covers) an orthographic projection of the second arm on the base substrate. Optionally, an orthographic projection of the first tip portion on a base substrate at least partially overlaps with an orthographic projection of the active layer of third transistor on the base substrate. Optionally, an orthographic projection of the first tip portion on a base substrate at least partially overlaps with an orthographic projection of the active layer of third transistor on the base substrate.

As used herein, the active layer refers to a component of the transistor comprising at least a portion of the semiconductor material layer whose orthographic projection on the base substrate overlaps with an orthographic projection of a gate electrode on the base substrate. As used herein, a source electrode refers to a component of the transistor connected to one side of the active layer, and a drain electrode refers to a component of the transistor connected to another side of the active layer. In the context of a double-gate type transistor (for example, the third transistor T3), the active layer refers to a component of the transistor comprising a first portion of the semiconductor material layer whose orthographic projection on the base substrate overlaps with an orthographic projection of a first gate on the base substrate, a second portion of the semiconductor material layer whose orthographic projection on the base substrate overlaps with an orthographic projection of a second gate on the base substrate, and a third portion between the first portion and the second portion. In the context of a double-gate type transistor, a source electrode refers to a component of the transistor connected to a side of the first portion distal to the third portion, and a drain electrode refers to a component of the transistor connected to a side of the second portion distal to the third portion.

In some embodiments, forming a respective one of the plurality of voltage supply lines includes forming a first parallel portion, forming a second parallel portion, and forming a first inclined portion connecting the first parallel portion and the second parallel portion along an inclined direction. Optionally, the first parallel portion and the second parallel portion respectively extend along a direction substantially parallel to the second direction. Optionally, the first inclined portion extends along an inclined angle with respect to the first direction. Optionally, the handle and the base portion are arranged along a direction substantially parallel to the second direction. Optionally, the connecting portion extends along a direction substantially parallel to the inclined direction.

In some embodiments, an orthographic projection of the first inclined portion on a base substrate substantially covers an orthographic projection of the connecting portion on the base substrate. Optionally, an orthographic projection of the first parallel portion on the base substrate at least partially overlaps with an orthographic projection of the handle on the base substrate. Optionally, an orthographic projection of the second parallel portion on the base substrate substantially covers an orthographic projection of the second tip portion on the base substrate.

In some embodiments, forming the pixel driving circuit further includes forming a second transistor and forming a third transistor. Optionally, forming the second transistor includes forming a gate electrode connected to a respective one of the plurality of gate lines, forming a source electrode connected to a respective one of the plurality of data lines, and forming a drain electrode connected to a source electrode of the driving transistor. Optionally, forming the third transistor includes forming a gate electrode connected to the respective one of the plurality of gate lines, forming a source electrode connected to the first capacitor electrode and a gate electrode of the driving transistor, and forming a drain electrode connected to a drain electrode of the driving transistor. Optionally, a drain electrode of the first transistor and a source electrode of the third transistor are formed as parts of a unitary structure in a respective one of a plurality of subpixels, at least a portion of the drain electrode of the first transistor directly connected to at least a portion of the source electrode of the third transistor. Optionally, the node connecting line is formed to be connected to the source electrode of the third transistor through the second via. Optionally, an orthographic projection of at least a portion of the drain electrode of the first transistor on a base substrate at least partially overlaps with an orthographic projection of the handle on the base substrate, at least partially overlaps with an orthographic projection of the first parallel portion on the base substrate, and at least partially overlaps with an orthographic projection of the base portion on the base substrate.

In some embodiments, forming the array substrate further includes forming a gate insulating layer on a side of the semiconductor material layer away from a base substrate, the first capacitor electrode being on a side of the gate insulating layer away from the base substrate; and forming an inter-layer dielectric layer on a side of the second capacitor electrode away from the insulating layer, the node connecting line and the plurality of voltage supply lines being on a side of the inter-layer dielectric layer away from the second capacitor electrode. Optionally, the first via is formed in a hole region in which a portion of the second capacitor electrode is absent, and extends through the inter-layer dielectric layer and the insulating layer, wherein an orthographic projection of the second capacitor electrode on a base substrate completely covers, with a margin, an orthographic projection of the first capacitor electrode on the base substrate except for the hole region. Optionally, the second via extends through the inter-layer dielectric layer, the insulating layer, and the gate insulating layer.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An array substrate, comprising:
a plurality of gate lines, a plurality of first reset control signal lines, a plurality of first reset signal lines, respectively extending along a first direction;
a plurality of data lines and a plurality of voltage supply lines, respectively extending along a second direction; and
a pixel driving circuit;
wherein the pixel driving circuit comprises a driving transistor; a first transistor, and a storage capacitor; and
the first transistor comprises a gate electrode connected to a respective one of the plurality of first reset control signal lines, a source electrode connected to a respective one of the plurality of first reset signal lines, and a drain electrode connected to a gate electrode of the driving transistor and a first capacitor electrode of the storage capacitor;
wherein the array substrate comprises a first initialization connecting line connecting the respective one of the plurality of first reset signal lines and a source electrode of the first transistor in a respective one of a plurality of subpixels, the respective one of the plurality of first reset signal lines configured to provide a reset signal to the source electrode of the first transistor, through the first initialization connecting line; and
the plurality of subpixels comprises a respective third subpixel;
the array substrate further comprises:
a respective third voltage supply line in the respective third subpixel;
a respective third anode electrically connected to a respective third light emitting element in the respective third subpixel; and
wherein an orthographic projection of the respective third anode on a base substrate substantially covers an orthographic projection of the first initialization connecting line on the base substrate, and covers an orthographic projection of at least portion of the respective third voltage supply line on the base substrate.

2. The array substrate of claim 1, wherein the first initialization connecting line is in a same layer as the plurality of data lines;
the first initialization connecting line is connected to the respective one of the plurality of first reset signal lines through a via extending through an inter-layer dielectric layer;
the first initialization connecting line is connected to the source electrode of the first transistor through a via extending through the inter-layer dielectric layer, an insulating layer, and a gate insulating layer; and
the first initialization connecting line crosses over a respective one of the plurality of first reset control signal lines.

3. The array substrate of claim 1, wherein an active layer and the drain electrode of the first transistor are parts of a unitary structure in the respective one of the plurality of subpixels;
at least a portion of the source electrode of the first transistor crosses over a respective one of the plurality of data lines; and
an orthographic projection of the first initialization connecting line on the base substrate is spaced apart from orthographic projections of at least a portion of the active layer and at least a portion of the drain electrode of the first transistor on the base substrate by an orthographic projection of the respective one of the plurality of data lines on the base substrate.

4. The array substrate of claim 1, further comprising:
a plurality of second reset control signal lines and a plurality of second reset signal lines, respectively extending along the first direction;
wherein the pixel driving circuit further comprises a second transistor; a third transistor, a fourth transistor, a fifth transistor, and a sixth transistor;
the sixth transistor comprises a gate electrode connected to a respective one of the plurality of second reset control signal lines, a source electrode connected to a respective one of the plurality of second reset signal lines, and a drain electrode connected to a drain electrode of the fifth transistor and an anode of a light emitting element;
wherein the array substrate comprises a second initialization connecting line connecting the respective one of the plurality of second reset signal lines and the source electrode of the sixth transistor in the respective one of the plurality of subpixels, the respective one of the plurality of second reset signal lines is configured to provide a reset signal to the source electrode of the sixth transistor through the second initialization connecting line;
the second initialization connecting line is connected to the respective one of the plurality of second reset signal lines through a via extending through an inter-layer dielectric layer;
the second initialization connecting line is connected to the source electrode of the sixth transistor through a via extending through the inter-layer dielectric layer, an insulating layer, and a gate insulating layer; and
the second initialization connecting line crosses over a respective one of the plurality of second reset control signal lines.

5. The array substrate of claim 4, wherein an active layer and the drain electrode of the sixth transistor are parts of a unitary structure in the respective one of a plurality of subpixels;

the source electrode of the sixth transistor crosses over a respective one of the plurality of data lines; and an orthographic projection of the second initialization connecting line on the base substrate is spaced apart from orthographic projections of the active layer and the drain electrode of the sixth transistor on the base substrate by an orthographic projection of the respective one of the plurality of data lines on the base substrate.

6. The array substrate of claim 1, wherein the storage capacitor comprises the first capacitor electrode, a second capacitor electrode electrically connected to a respective one of the plurality of voltage supply lines, and an insulating layer between the first capacitor electrode and the second capacitor electrode;

wherein the array substrate comprises:

a semiconductor material layer on the base substrate;

a node connecting line in a same layer as the respective one of the plurality of voltage supply lines, connected to the first capacitor electrode through a first via, and connected to the semiconductor material layer through a second via; and an interference preventing block in a same layer as the second capacitor electrode, the respective one of the plurality of voltage supply lines connected to the interference preventing block through a third via.

7. The array substrate of claim 6, wherein at least a portion of the drain electrode of the first transistor and a portion of the semiconductor material layer at a position connecting to the node connecting line are arranged along a direction substantially parallel to the second direction.

8. The array substrate of claim 7, wherein the pixel driving circuit further comprises a second transistor and a third transistor;

the second transistor comprises a gate electrode connected to a respective one of the plurality of gate lines, a source electrode connected to a respective one of the plurality of data lines, and a drain electrode connected to a source electrode of the driving transistor;

the third transistor comprises a gate electrode connected to the respective one of the plurality of gate lines, a source electrode connected to the first capacitor electrode and a gate electrode of the driving transistor, and a drain electrode connected to a drain electrode of the driving transistor;

the portion of the semiconductor material layer at a position connecting to the node connecting line comprises at least a portion of the source electrode of the third transistor;

the source electrode of the third transistor and the drain electrode of the first transistor are parts of a unitary structure in a respective one of a plurality of subpixels; and a portion of the unitary structure extends along a direction substantially parallel to the second direction.

9. The array substrate of claim 6, wherein an orthographic projection of the interference preventing block on the base substrate substantially covers at least 80% of an orthographic projection of the drain electrode of the first transistor on the base substrate.

10. The array substrate of claim 6, wherein the interference preventing block comprises a handle, a first arm and a second arm;

the respective one of the plurality of voltage supply lines is connected to the handle through the third via;

the first arm comprises a L-shaped portion and a first tip portion;

the second arm comprises a base portion, a second tip portion, and a connecting portion connecting the base portion and the second tip portion;

the base portion connects the L-shaped portion and the handle; and along the first direction, a portion of the node connecting line at a position connecting to the semiconductor material layer through the second via is spaced apart from a first adjacent data line by the first arm, and is spaced apart from a second adjacent data line by the second arm.

11. The array substrate of claim 10, wherein a combination of an orthographic projection of the base portion of the second arm on the base substrate and an orthographic projection of the handle on the base substrate substantially covers at least 80% of the orthographic projection of the drain electrode of the first transistor on the base substrate.

12. The array substrate of claim 10, wherein the pixel driving circuit further comprises a second transistor and a third transistor;

the second transistor comprises a gate electrode connected to a respective one of the plurality of gate lines, a source electrode connected to a respective one of the plurality of data lines, and a drain electrode connected to a source electrode of the driving transistor;

the third transistor comprises a gate electrode connected to the respective one of the plurality of gate lines, a source electrode connected to the first capacitor electrode and a gate electrode of the driving transistor, and a drain electrode connected to a drain electrode of the driving transistor;

at least a portion of the drain electrode of the first transistor and the portion of the semiconductor material layer at a position connecting to the node connecting line are arranged along a direction substantially parallel a direction along which the handle and the base portion are arranged; and/or at least a portion of the source electrode of the third transistor and at least a portion of the drain electrode of the first transistor are arranged along a direction substantially parallel to the direction along which the handle and the base portion are arranged.

13. The array substrate of claim 1, wherein the respective third voltage supply line comprises a main portion and a loop portion connected to the main portion; and the orthographic projection of the respective third anode on the base substrate at least partially overlaps with the orthographic projection of the first initialization connecting line on the base substrate, and at least partially overlap with an orthographic projection of the loop portion on the base substrate.

14. The array substrate of claim 13, wherein an orthographic projection of a respective one of the plurality of data lines on the respective third anode is between an orthographic projection of the first initialization connecting line on the respective third anode and an orthographic projection of the loop portion on the respective third anode.

15. The array substrate of claim 13, wherein the loop portion comprises a first loop sub-portion along a direction substantially parallel to the second direction, a second loop sub-portion substantially parallel to the first direction, and a third loop sub-portion substantially parallel to the first direction;

the second loop sub-portion and the third loop sub-portion respectively connect the first loop sub-portion to the main portion of the respective third voltage supply line;

the array substrate further comprises a loop hole extending through the respective third voltage supply line; and a perimeter of the loop hole is surrounded by a combination of the first loop sub-portion, the second loop sub-portion, the third loop sub-portion, and the main portion.

16. The array substrate of claim 15, wherein the orthographic projection of the respective third anode on the base substrate at least partially overlaps with an orthographic projection of the first loop sub-portion on the base substrate; and an orthographic projection of a respective one of the plurality of data lines on the respective third anode is between an orthographic projection of the first initialization connecting line on the respective third anode and an orthographic projection of the first loop sub-portion on the respective third anode.

17. The array substrate of claim 13, wherein signal lines are distributed underneath the respective third anode by having the first initialization connecting line underneath the respective third anode on a first side along a first edge of the respective third anode and the loop portion underneath the respective third anode on a second side along a second edge of the respective third anode; and the first side and the second side are opposite to each other.

18. The array substrate of claim 13, wherein the first initialization connecting line is configured to provide the reset signal to the source electrode of the first transistor; and the loop portion is configured to provide a high voltage signal, which is transmitted to a second capacitor electrode of the storage capacitor in the respective third subpixel.

19. The array substrate of claim 1, wherein the plurality of subpixels further comprises a respective first subpixel, a respective second subpixel, and a respective fourth subpixel;

the array substrate further comprises:
a respective first voltage supply line in the respective first subpixel;

a respective second voltage supply line in the respective second subpixel;

a respective fourth voltage supply line in the respective fourth subpixel;

a respective first anode electrically connected to a respective first light emitting element in the respective first subpixel;

a respective second anode electrically connected to a respective second light emitting element in the respective second subpixel; and a respective fourth anode electrically connected to a respective fourth light emitting element in the respective fourth subpixel.

20. A display apparatus, comprising the array substrate of claim 1, and an integrated circuit connected to the array substrate.

* * * * *